United States Patent
Mase et al.

(10) Patent No.: US 12,302,018 B2
(45) Date of Patent: May 13, 2025

(54) PHOTOSENSOR, AND DRIVING METHOD FOR PHOTOSENSOR

(71) Applicant: HAMAMATSU PHOTONICS K.K., Hamamatsu (JP)

(72) Inventors: Mitsuhito Mase, Hamamatsu (JP); Hiroo Yamamoto, Hamamatsu (JP); Harumichi Mori, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/798,999

(22) PCT Filed: Nov. 18, 2020

(86) PCT No.: PCT/JP2020/043043
§ 371 (c)(1),
(2) Date: Aug. 11, 2022

(87) PCT Pub. No.: WO2021/166348
PCT Pub. Date: Aug. 26, 2021

(65) Prior Publication Data
US 2023/0107985 A1    Apr. 6, 2023

(30) Foreign Application Priority Data
Feb. 20, 2020 (JP) .................... 2020-027369

(51) Int. Cl.
H04N 25/711 (2023.01)
H04N 25/40 (2023.01)

(52) U.S. Cl.
CPC .......... *H04N 25/711* (2023.01); *H04N 25/41* (2023.01)

(58) Field of Classification Search
CPC ............ H01L 27/146; H01L 27/14601; H01L 27/14612; H04N 25/131; H04N 25/135;
(Continued)

(56) References Cited

U.S. PATENT DOCUMENTS 11,194,025 B2 * 12/2021 Suzuki ............. H01L 27/14825
11,399,148 B2 *  7/2022 Suzuki ................. G01S 7/4865
(Continued)

FOREIGN PATENT DOCUMENTS

| CN | 101688915 A | 3/2010 |
|---|---|---|
| CN | 102333477 A | 1/2012 |

(Continued)

OTHER PUBLICATIONS

International Preliminary Report on Patentability mailed Sep. 1, 2022 for PCT/JP2021/002096.
(Continued)

*Primary Examiner* — Antoinette T Spinks
(74) *Attorney, Agent, or Firm* — Faegre Drinker Biddle & Reath LLP

(57) ABSTRACT

Provided is a photosensor including a light receiving part generating electric charge according to incident light, a charge transfer gate configured to transfer the electric charge generated in the light receiving part, and a signal generation unit configured to generate a charge transfer signal applied to the charge transfer gate, in which the signal generation unit generates the charge transfer signal so that the charge transfer gate is brought into a charge transfer state in a first time range of a first period belonging to an n-th (n is an integer of 1 or more) frame and the charge transfer gate is brought into a charge transfer state in a second time range of a second period belonging to an m-th (m is an integer of 1 or more different from n) frame.

16 Claims, 14 Drawing Sheets

(58) Field of Classification Search
CPC ........ H04N 25/46; H04N 25/53; H04N 25/70;
H04N 25/76; H04N 25/771; H04N 25/41;
H04N 25/711; H04N 25/77; G01S 17/86;
G01S 17/89; G01S 7/481; G01S 7/4816;
G01S 7/4863; G01S 7/4865; G01N
21/6408; G01N 21/645
USPC ........................................................ 348/294
See application file for complete search history.

(56) References Cited

U.S. PATENT DOCUMENTS

| | | | |
|---|---|---|---|
| 2006/0097781 | A1 | 5/2006 | Beer et al. |
| 2011/0317878 | A1* | 12/2011 | Kang ...................... G01S 17/10 |
| | | | 382/106 |
| 2012/0307035 | A1 | 12/2012 | Yaqoob et al. |
| 2016/0356718 | A1 | 12/2016 | Yoon et al. |
| 2017/0045618 | A1* | 2/2017 | Mase ...................... H01L 31/12 |
| 2017/0332025 | A1 | 11/2017 | Nozawa et al. |
| 2018/0156898 | A1* | 6/2018 | Suzuki ................. H04N 25/771 |
| 2022/0059588 | A1* | 2/2022 | Lee ..................... H01L 27/1463 |

FOREIGN PATENT DOCUMENTS

| | | |
|---|---|---|
| CN | 102843958 A | 12/2012 |
| EP | 1458087 A1 | 9/2004 |
| JP | 2005-114528 A | 4/2005 |
| JP | 2005-114538 A | 4/2005 |
| JP | 2009-014460 A | 1/2009 |
| JP | 2011-177379 A | 9/2011 |
| JP | 2014-508922 A | 4/2014 |
| JP | 2015-215181 A | 12/2015 |
| JP | 2017-208812 A | 11/2017 |
| WO | WO-2012/103233 A1 | 8/2012 |
| WO | WO-2015/119243 A1 | 8/2015 |
| WO | WO-2017/022220 A1 | 2/2017 |
| WO | WO-2020/008962 A1 | 1/2020 |

OTHER PUBLICATIONS

International Preliminary Report on Patentability mailed Sep. 1, 2022 for PCT/JP2020/043043.

Stephan Beer and Peter Seitz, "Real-Time Tomographic Imaging Without X-Rays: a Smart Pixel Array With Massively Parallel Signal Processing for Real-Time Optical Coherence Tomography Performing Close to the Physical Limits," Published in: Research in Microelectronics and Electronics, 2005 PhD, Date of Conference: Jul. 28-28, 2005, Date Added to IEEE Xplore: Dec. 12, 2005, Print ISBN: 0-7803-9345-7, DOI: 10.1109/RME.2005.1542955, Publisher: IEEE, Conference Location: Lausanne, Switzerland, p. 135-138, 2005.

Montgomery PC et al, "Towards real time 3D quantitative characterisation of in situ layer growth using white light interference microscopy", Journal of Physics: Conference Series, Institute of Physics Publishing, Bristol, GB, vol. 253, No. 1, Dec. 7, 2010, p. 12017, XP020200630.

Experimental research and simulation of wide-field optical coherance tomograph, "Applied Optics", Jul. 15, 2009, inlcuding partial English translation.

PC Montgomery, Tpwards real time 3D quantitative characteristiion of in situlayer growth using white light interference microscopy,"Journal Physics : Conference Serie", Dec. 31, 2010.

* cited by examiner (a)

(b)

(c)

(a)

(b)

(a) THIRD FRAME (b) FOURTH FRAME (a) FIRST FRAME (b) SECOND FRAME (a) FIRST FRAME (b) SECOND FRAME (a) THIRD FRAME (b) FOURTH FRAME (a)

(b)

(c)

PHOTOSENSOR, AND DRIVING METHOD FOR PHOTOSENSOR

TECHNICAL FIELD

The present disclosure relates to a photosensor and a driving method for the photosensor.

BACKGROUND ART

Patent Literature 1 describes a fluorescence lifetime measuring device. This device includes a measuring unit that irradiates a sample with excitation light to generate fluorescent photons and detects the generated fluorescent photons, a signal processing unit that measures the number of fluorescent photons for each of a plurality of time gates from signals of the fluorescent photons detected by the measuring unit, an arithmetic processing unit that calculates a fluorescence lifetime on the basis of the number of fluorescent photons measured for each of the plurality of time gates, and a control unit that controls the measuring unit, the signal processing unit, and the arithmetic processing unit. The measuring unit includes a detector that converts the fluorescent photons emitted from the sample in an excitation state into an electrical signal and outputs the electrical signal to the signal processing unit. The signal processing unit amplifies the electrical signal input from the detector by an amplifier and branches it into two switches. The switches are each controlled by a gate control signal from the control unit to control a timing of an ON/OFF operation, and output an electrical signal only during an ON operation.

CITATION LIST

Patent Literature

[Non-Patent Literature 1] Japanese Unexamined Patent Publication No. 2005-114528

SUMMARY OF INVENTION

Technical Problem

Incidentally, according to knowledge of the present inventor, in order to improve a time resolution of an image sensor and improve a detection accuracy, it is necessary to control a charge transfer gate in a shorter time, but there is a limit when a travel time of a carrier is considered. On the other hand, in the device described in Patent Literature 1, as described above, the electrical signal from the detector is I-V converted by an amplifier and then is branched to two switches. Then, ON periods of the two switches partially overlap. According to this, the time resolution can be regarded as being improved.

However, if it is a signal after I-V conversion as in the device of Patent Literature 1, although it is possible to acquire a signal by overlapping ON periods of the plurality of switches, when an attempt is made to overlap charge transfer periods of a charge transfer gate as in the device of Patent Literature 1 in an image sensor utilizing a charge transfer gate, it is difficult to evenly distribute electric charge. Further, if there is only one light receiving part (single element), it is conceivable that the configuration of the device of Patent Literature 1 can be realized, but when light receiving parts are disposed one-dimensionally or two-dimensionally, the circuit scale will become enormous and the feasibility will become poor.

Therefore, it is an objective of the present disclosure to provide a photosensor in which a detection accuracy can be improved by controlling a charge transfer gate, and a driving method for the photosensor.

Solution to Problem

A photosensor according to the present disclosure includes a light receiving part configured to generate electric charge according to incident light, a charge transfer gate configured to transfer the electric charge generated in the light receiving part, and a signal generation unit configured to generate a charge transfer signal applied to the charge transfer gate, in which the signal generation unit generates the charge transfer signal so that the charge transfer gate is brought into a charge transfer state in a first time range of a first period belonging to an n-th (n is an integer of 1 or more) frame and the charge transfer gate is brought into a charge transfer state in a second time range of a second period belonging to an m-th (m is an integer of 1 or more different from n) frame, and a part of the first time range and a part of the second time range overlap each other when a start time of the first period and a start time of the second period are made to match.

A driving method for a photosensor according to the present disclosure is a driving method for a photosensor including a light receiving part configured to generate electric charge according to incident light, and a charge transfer gate configured to transfer the electric charge generated in the light receiving part, and the driving method includes generating a charge transfer signal applied to the charge transfer gate so that the charge transfer gate is brought into a charge transfer state in a first time range of a first period belonging to an n-th (n is an integer of 1 or more) frame and the charge transfer gate is brought into a charge transfer state in a second time range of a second period belonging to an m-th (m is an integer of 1 or more different from n) frame, wherein a part of the first time range and a part of the second time range overlap each other when a start time of the first period and a start time of the second period are made to match.

In the photosensor and the driving method for the photosensor, the charge transfer signal applied to the charge transfer gate for transferring the electric charge generated in the light receiving part is generated so that the charge transfer gate is brought into a charge transfer state in the first time range of the first period belonging to the n-th frame and the charge transfer gate is brought into a charge transfer state in the second time range of the second period belonging to the m-th frame. The first time range and the second time range are ON periods of the charge transfer gate. Then, when the start time of the first period and the start time of the second period are made to match, a part of the first time range and a part of the second time range overlap each other. In this way, if the ON periods of the charge transfer gate are made to overlap between frames different from each other, at least a phenomenon that occurs repeatedly corresponding to each frame can be caught at a time interval according to an amount of deviation during the ON periods. That is, a time resolution can be improved and a detection accuracy can be improved.

In the photosensor according to the present disclosure, the n-th frame and the m-th frame may be frames continuous with each other. A configuration in which the ON periods partially overlap between frames continuous with each other as described above is effective for a phenomenon that occurs repeatedly while changing slightly. This is because a change in the phenomenon between frames is relatively small compared to a case in which an interval between frames whose ON periods are made to partially overlap is long. Further, the n-th frame and the m-th frame being continuous with each other corresponds to a case in which m is n±1.

In the photosensor according to the present disclosure, the signal generation unit may generate the charge transfer signal so that the charge transfer gate is brought into a charge transfer state in an overlapping time range when a start time of a period is made to match over a plurality of the periods in one frame. In this case, integration of electric charge can be performed in one frame.

In the photosensor according to the present disclosure, the charge transfer gate may include a first charge transfer gate and a second charge transfer gate, and the signal generation unit may generate the charge transfer signal so that one of the first charge transfer gate and the second charge transfer gate is brought into a charge transfer state in the first time range, and the one of the first charge transfer gate and the second charge transfer gate is brought into a charge transfer state in the second time range. As described above, in the photosensor including a plurality of charge transfer gates, at least ON periods of the same charge transfer gate may be made to overlap in the n-th frame and the m-th frame.

In the photosensor according to the present disclosure, the charge transfer gate may include a first charge transfer gate and a second charge transfer gate, and the signal generation unit may generate the charge transfer signal so that one of the first charge transfer gate and the second charge transfer gate is brought into a charge transfer state in the first time range, and the other of the first charge transfer gate and the second charge transfer gate is brought into a charge transfer state in the second time range. As described above, in the photosensor including the plurality of charge transfer gates, at least ON periods of the charge transfer gates different from each other may be made to overlap in the n-th frame and the m-th frame.

In the photosensor according to the present disclosure, the charge transfer gate may include a first charge transfer gate and a second charge transfer gate, the signal generation unit may generate the charge transfer signal so that the first charge transfer gate is brought into a charge transfer state in the first time range, and the first charge transfer gate is brought into a charge transfer state in the second time range, the second charge transfer gate is brought into a charge transfer state in a third time range of the first period, and the second charge transfer gate is brought into a charge transfer state in a fourth time range of the second period, and a part of the third time range and a part of the fourth time range may overlap each other when a start time of the first period and a start time of the second period are made to match. As described above, for the photosensor including the plurality of charge transfer gates, when ON periods of the respective charge transfer gates are made to partially overlap, the number of frames can be reduced while improving a time resolution thereof.

In the photosensor according to the present disclosure, the signal generation unit may further generate a signal for a light source to periodically output light, and start times of the first period and the second period may be synchronized with a timing at which the light source outputs the light. In this case, a time resolution can be improved and a detection accuracy can be improved for a phenomenon (for example, fluorescence) that occurs repeatedly due to the light from the light source.

Here, the photosensor according to the present disclosure includes a light receiving part configured to generate electric charge according to incident light, a first charge transfer gate and a second charge transfer gate configured to transfer the electric charge generated in the light receiving part, a discharge gate configured to discharge the electric charge generated in the light receiving part, and a signal generation unit configured to generate a charge transfer signal applied to the first charge transfer gate, the second charge transfer gate, and the discharge gate, in which the signal generation unit generates the charge transfer signal so that the first charge transfer gate is brought into a charge transfer state in a first time range, the second charge transfer gate is brought into a charge transfer state in a second time range separated from the first time range, and the discharge gate is brought into a charge discharge state in a third time range between the first time range and the second time range.

Also, a driving method for a photosensor according to the present disclosure is a driving method for a photosensor including a light receiving part configured to generate electric charge according to incident light, a first charge transfer gate and a second charge transfer gate configured to transfer the electric charge generated in the light receiving part, and a discharge gate configured to discharge the electric charge generated in the light receiving part, and the driving method includes generating a charge transfer signal so that the first charge transfer gate is brought into a charge transfer state in a first time range, the second charge transfer gate is brought into a charge transfer state in a second time range separated from the first time range, and the discharge gate is brought into a charge discharge state in a third time range between the first time range and the second time range.

In the photosensor and the driving method for the photosensor, the charge transfer signal applied to the first and second charge transfer gates for transferring the electric charge generated in the light receiving part is configured to bring the first charge transfer gate into a charge transfer state in the first time range, bring the second charge transfer gate into a charge transfer state in the second time range separated from the first time range, and bring the discharge gate into a charge discharge state in the third time range between the first time range and the second time range. The first time range and the second time range are ON periods of the charge transfer gate, and the third time range is a discharge period of the electric charge. In this way, the ON periods of the charge transfer gates are separated and the discharge period of the electric charge is provided therebetween, and thereby unread electric charge generated in the light receiving part can be discharged. As a result, a detection accuracy can be improved.

In the photosensor according to the present disclosure, the signal generation unit may generate the charge transfer signal so that the first time range, the second time range, and the third time range are included in each of a plurality of frames, and when a start time of the n-th (n is an integer of 1 or more) frame and a start time of the m-th (m is an integer of 1 or more different from n) frame are made to match, the first time range of the m-th frame is positioned between the first time range of the frame and the second time range of the n-th frame. As described above, the detection accuracy can be further improved by disposing the ON periods of the charge transfer gates more densely over the plurality of frames.

In the photosensor according to the present disclosure, the signal generation unit may generate the charge transfer signal so that the first charge transfer gate and the second charge transfer gate are brought into a charge transfer state in overlapping time ranges when a start time of a period is made to match over a plurality of the periods in one frame. In this case, integration of electric charge can be performed in one frame.

Advantageous Effects of Invention

According to the present disclosure, it is possible to provide a photosensor in which a detection accuracy can be improved by controlling a charge transfer gate, and a driving method for the photosensor.

DESCRIPTION OF EMBODIMENTS

Hereinafter, one embodiment will be described in detail with reference to the drawings. In each of the drawings, the same or corresponding elements will be denoted by the same reference signs, and duplicate description thereof may be omitted.

First Embodiment

Figure 1:
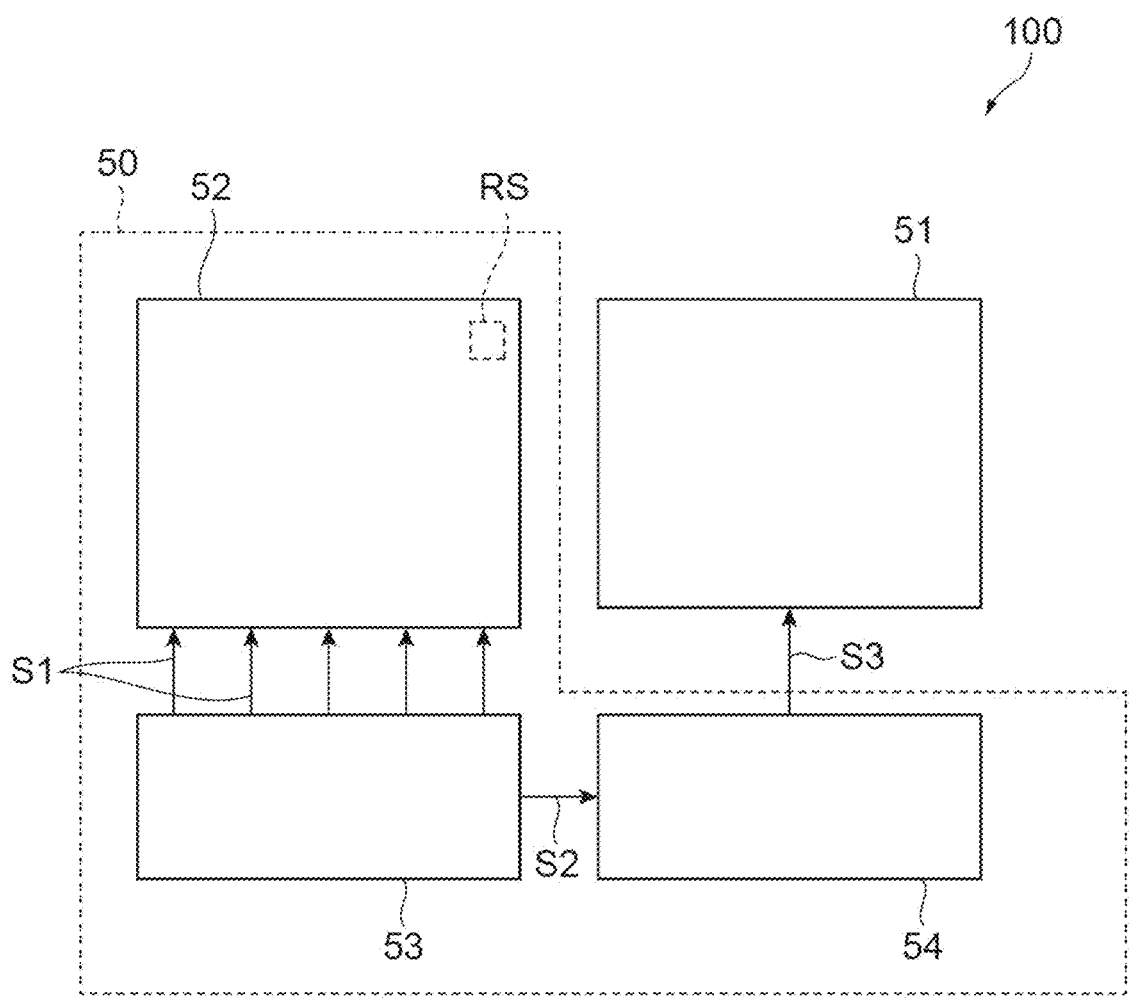
FIG. 1 is a block diagram showing a photodetector according to an embodiment.

FIG. 1 is a block diagram showing a photodetector according to an embodiment. A photodetector 100 shown in FIG. 1 is, for example, an image sensor (gate image sensor), a motion sensor, a range sensor, a range image sensor, or the like. The photodetector 100 includes a photosensor 50 and a light source 51. The photosensor 50 includes a sensor unit 52, a timing generator (signal generation unit) 53, and a delay circuit 54. The light source 51 includes, for example, an LED or the like and outputs pulsed light with respect to an object. The sensor unit 52 detects light (reflected light or fluorescence) from an object due to pulsed light from the light source 51. The sensor unit 52 includes a plurality of pixel units RS disposed two-dimensionally. The sensor unit 52 may be configured by monolithically forming the pixel units RS and a CMOS reading circuit unit on a semiconductor substrate (for example, a silicon substrate).

Figure 2:
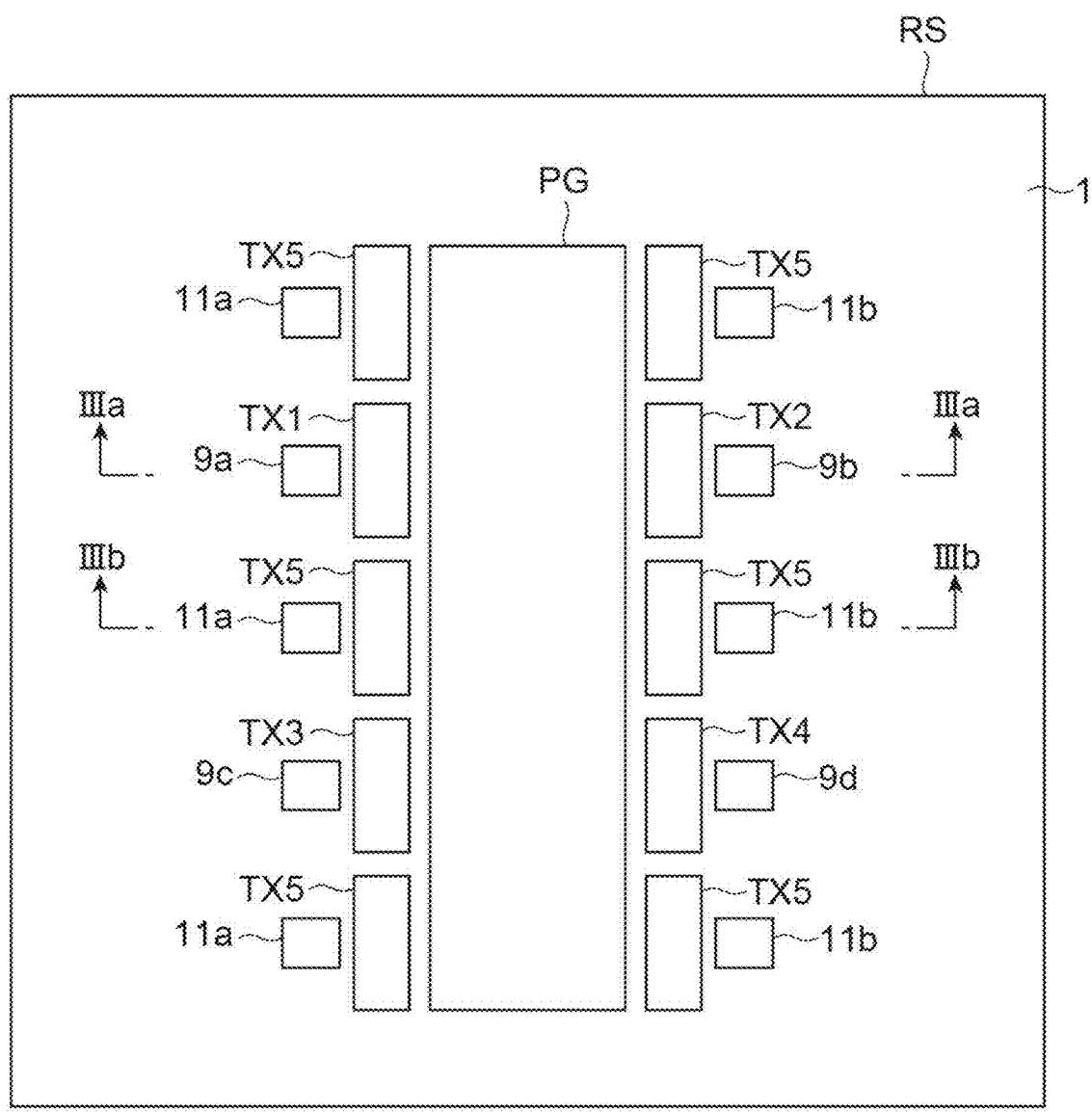
FIG. 2 is a schematic plan view of a pixel unit shown in FIG. 1.
Figure 3:
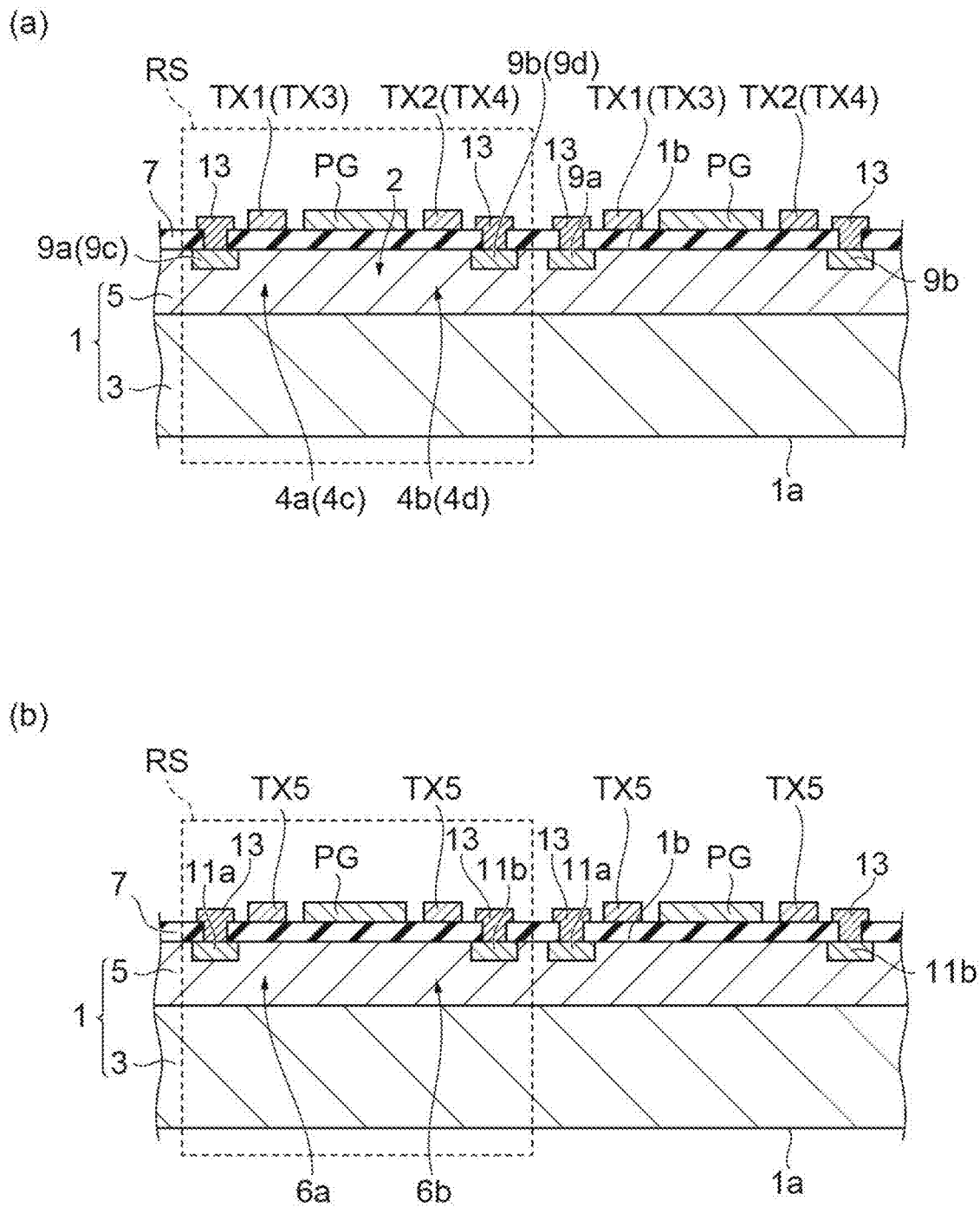
FIG. 3 is a cross-sectional view of the pixel unit shown in FIG. 2.

FIG. 2 is a schematic plan view of a pixel unit shown in FIG. 1. FIG. 3 is a cross-sectional view of the pixel unit shown in FIG. 2. FIG. 3($a$) is a cross-sectional view along line IIIa-IIIa of FIG. 2, and FIG. 3($b$) is a cross-sectional view along line IIIb-IIIb of FIG. 2. As illustrated in FIGS. 2 and 3, the photosensor 50 includes a semiconductor substrate 1 having a first main surface 1$a$ and a second main surface 1$b$ facing each other in the sensor unit 52 (pixel units RS). The semiconductor substrate 1 includes a p-type first semiconductor region 3 positioned on the first main surface 1$a$ side and a p$^-$-type second semiconductor region 5 having a lower impurity concentration than the first semiconductor region 3 and positioned on the second main surface 1$b$ side. The semiconductor substrate 1 can be obtained, for example, by growing a p$^-$-type epitaxial layer having a lower impurity concentration than the semiconductor substrate on the p-type semiconductor substrate. An insulating layer 7 is formed on the second main surface 1$b$ (the second semiconductor region 5) of the semiconductor substrate 1.

A photogate electrode PG is disposed on the insulating layer 7. The photogate electrode PG has a rectangular shape in a plan view. In the present embodiment, the photogate electrode PG has a rectangular shape. A region corresponding to the photogate electrode PG (a region positioned below the photogate electrode PG in FIG. 3) in the semiconductor substrate 1 (the second semiconductor region 5) functions as a light receiving part 2 that generates electric charge due to incident light. That is, the photosensor 50 includes a plurality of light receiving parts 2 disposed two-dimensionally (disposition of the light receiving parts 2 may also be one-dimensional).

In the second semiconductor region 5, n-type third semiconductor regions 9$a$ and 9$b$ having a high impurity concentration are formed to face each other in regions positioned away from the photogate electrode PG. The third semiconductor region 9$a$ is a first charge accumulation part for accumulating the electric charge generated in the light receiving part 2, and the third semiconductor region 9$b$ is similarly a second charge accumulation part for accumulating the electric charge generated in the light receiving part 2. The third semiconductor regions 9$a$ and 9$b$ are disposed to face each other with the photogate electrode PG interposed therebetween. The third semiconductor regions 9$a$ and 9$b$ have a rectangular shape in a plan view. In the present embodiment, the third semiconductor regions 9$a$ and 9$b$ have a square shape.

In the second semiconductor region 5, n-type third semiconductor regions 9$c$ and 9$d$ having a high impurity concentration are formed to face each other in regions positioned away from the photogate electrode PG. The third semiconductor region 9$c$ is a third charge accumulation part for accumulating the electric charge generated in the light receiving part 2, and the third semiconductor region 9$d$ is similarly a fourth charge accumulation part for accumulating the electric charge generated in the light receiving part 2. The third semiconductor regions 9$c$ and 9$d$ are disposed to face each other with the photogate electrode PG interposed therebetween.

The third semiconductor regions 9$a$ and 9$c$ are disposed to face each other with a fourth semiconductor region 11$a$ to be described later interposed therebetween. The third semiconductor regions 9b and 9d are disposed to face each other with a fourth semiconductor region 11b to be described later interposed therebetween. The third semiconductor regions 9c and 9d have a rectangular shape in a plan view. In the present embodiment, the third semiconductor regions 9c and 9d have a square shape.

In the second semiconductor region 5, n-type fourth semiconductor regions 11a and 11b having a high impurity concentration are formed in regions positioned away from the photogate electrode PG. The fourth semiconductor regions 11a and 11b are charge discharge parts for discharging the electric charge generated by the light receiving part 2 to the outside. In the present embodiment, three pairs of the fourth semiconductor regions 11a and 11b are disposed for the photogate electrode PG. The fourth semiconductor regions 11a and 11b are disposed to face each other with the photogate electrode PG interposed therebetween. The fourth semiconductor regions 11a and 11b have a rectangular shape in a plan view. In the present embodiment, the fourth semiconductor regions 11a and 11b have a square shape.

Further, in the present embodiment, "an impurity concentration being high" means that, for example, an impurity concentration is about $1 \times 10^{17}$ cm$^{-3}$ or higher, and "+" is appended as a conductive type thereof. On the other hand, "an impurity concentration being low" means that, for example, an impurity concentration is about $10 \times 10^{15}$ cm$^{-3}$ or lower, and "−" is appended as a conductive type thereof. A thickness/impurity concentration of each semiconductor region is as follows. The first semiconductor region 3: Thickness 10 to 1000 μm/Impurity concentration $1 \times 10^{12}$ cm$^{-3}$ to $1 \times 10^{19}$ cm$^{-3}$. The second semiconductor region 5: Thickness 1 to 50 μm/Impurity concentration: $1 \times 10^{12}$ cm$^{-3}$ to $1 \times 10^{15}$ cm$^{-3}$. The third semiconductor regions 9a and 9b and the fourth semiconductor regions 11a and 11b: Thickness 0.1 to 1 μm/Impurity concentration: $1 \times 10^{18}$ cm$^{-3}$ to $1 \times 10^{20}$ cm$^{-3}$.

A reference potential such as a ground potential is applied to the semiconductor substrate 1 (the first semiconductor region 3 and the second semiconductor region 5) via a back gate, a through electrode, or the like.

A transfer electrode TX1, a transfer electrode TX2, a transfer electrode TX3, and a transfer electrode TX4 are disposed on the insulating layer 7 to correspond to the photogate electrode PG. The transfer electrode TX1 is positioned between the photogate electrode PG and the third semiconductor region 9a, and is disposed away from the photogate electrode PG. The transfer electrode TX2 is positioned between the photogate electrode PG and the third semiconductor region 9b, and is disposed away from the photogate electrode PG.

The transfer electrode TX3 is positioned between the photogate electrode PG and the third semiconductor region 9c, and is disposed away from the photogate electrode PG. The transfer electrode TX4 is positioned between the photogate electrode PG and the third semiconductor region 9d, and is disposed away from the photogate electrode PG. The transfer electrodes TX1 to TX4 have a rectangular shape in a plan view. In the present embodiment, the transfer electrodes TX1 to TX4 have a rectangular shape.

A region of the semiconductor substrate 1 (the second semiconductor region 5) corresponding to the transfer electrode TX1 (a region positioned below the transfer electrode TX1 in FIG. 3) functions as a charge transfer gate 4a for transferring the electric charge generated in the light receiving part 2 to the third semiconductor region 9a which is the first charge accumulation part. A region of the semiconductor substrate 1 (the second semiconductor region 5) corresponding to the transfer electrode TX2 (a region positioned below the transfer electrode TX2 in FIG. 3) functions as a charge transfer gate 4b for transferring the electric charge generated in the light receiving part 2 to the third semiconductor region 9b which is the second charge accumulation part.

A region of the semiconductor substrate 1 (the second semiconductor region 5) corresponding to the transfer electrode TX3 (a region positioned below the transfer electrode TX3 in FIG. 3) functions as a charge transfer gate 4c for transferring the electric charge generated in the light receiving part 2 to the third semiconductor region 9c which is the third charge accumulation part. A region of the semiconductor substrate 1 (the second semiconductor region 5) corresponding to the transfer electrode TX4 (a region positioned below the transfer electrode TX4 in FIG. 3) functions as a charge transfer gate 4d for transferring the electric charge generated in the light receiving part 2 to the third semiconductor region 9d which is the fourth charge accumulation part.

A plurality (here, six) of transfer electrodes TX5 are disposed on the insulating layer 7 to correspond to the photogate electrode PG. Some of the plurality of transfer electrodes TX5 on one side of the photogate electrode PG are each positioned between the photogate electrode PG and the fourth semiconductor region 11a, and are disposed away from the photogate electrode PG with the transfer electrode TX1 and the transfer electrode TX3 interposed therebetween. The remainder of the plurality of transfer electrodes TX5 on the other side of the photogate electrode PG are each positioned between the photogate electrode PG and the fourth semiconductor region 11b, and are disposed away from the photogate electrode PG with the transfer electrode TX2 and the transfer electrode TX4 interposed therebetween. The transfer electrode TX5 has a rectangular shape in a plan view. In the present embodiment, the transfer electrode TX5 has a rectangular shape, and has the same shape as the transfer electrode TX1 or the like.

A region of the semiconductor substrate 1 (the second semiconductor region 5) corresponding to the transfer electrode TX5 on the one side (a region positioned below the transfer electrode TX5 on the one side in FIG. 3) functions as a discharge gate 6a for transferring the electric charge generated in the light receiving part 2 to the fourth semiconductor region 11a which is the charge discharge part. A region of the semiconductor substrate 1 (the second semiconductor region 5) corresponding to the transfer electrode TX5 on the other side (a region positioned below the transfer electrode TX5 on the other side in FIG. 3) functions as a discharge gate 6b for transferring the electric charge generated in the light receiving part 2 to the fourth semiconductor region 11b which is the charge discharge part. As described above, the discharge gates 6a and 6b are for discharging the electric charge generated in the light receiving part 2.

Further, a length dimension of each of the transfer electrodes TX1 to TX5 in a direction facing the photogate electrode PG, that is, a gate width of each of the transfer electrodes TX1 to TX5 is determined according to a transferable distance of signal charge and unnecessary charge so that a region of the photogate electrode PG that allows high-speed transfer of the signal charge and the unnecessary charge is covered in each of the transfer electrodes TX1 to TX5.

A contact hole for exposing a surface of the first semiconductor region 3 is provided in the insulating layer 7. A conductor 13 for connecting each of the third semiconductor regions 9a and 9b and each of the fourth semiconductor regions 11a and 11b to the outside is disposed in the contact hole. The semiconductor substrate is formed of Si as an example, and the insulating layer 7 is formed of $SiO_2$ as an example. The photogate electrode PG and the transfer electrodes TX1 to TX5 are formed of polysilicon as an example. Further, other materials may be used for those described above.

As described above, the third semiconductor regions 9a and 9d are for accumulating the electric charge generated in the light receiving part 2 due to the incident light. Phases of charge transfer signals applied to the transfer electrodes TX1 to TX4 are different from each other. Light incident on one pixel unit RS is converted into electric charge in the semiconductor substrate 1 (second semiconductor region 5), and some of the electric charge generated in this way travels in directions of the transfer electrodes TX1 to TX4 as signal charge according to a potential gradient formed due to a voltage applied to the photogate electrode PG and the transfer electrodes TX1 to TX4.

When a positive potential is applied to the transfer electrodes TX1 to TX4, potentials below the transfer electrodes TX1 to TX4 become lower than potentials of the semiconductor substrate 1 (the second semiconductor region 5) at portions below the photogate electrode PG with respect to electrons, and negative charge (electron) is pulled in directions of the transfer electrodes TX1 to TX4 and is accumulated in potential wells formed by the third semiconductor regions 9a to 9d.

An n-type semiconductor contains a positively ionized donor, has a positive potential, and attracts electrons. When a potential (ground potential) lower than the above-described positive potential is applied to the transfer electrodes TX1 to TX4, potential barriers due to the transfer electrodes TX1 to TX4 are generated, and electric charge generated in the semiconductor substrate 1 is not pulled into the third semiconductor regions 9a to 9d.

The fourth semiconductor regions 11a and 11b are for collecting unnecessary charge generated in the light receiving part 2 due to the incident light and discharging them to the outside. Some of the electric charge generated in the semiconductor substrate 1 (second semiconductor region 5) due to light incident on one pixel unit RS travels in a direction of the transfer electrode TX5 as unnecessary charge according to a potential gradient formed due to a voltage applied to the photogate electrode PG and the transfer electrodes TX 5.

When a positive potential is applied to the transfer electrodes TX5, potentials below the transfer electrodes TX5 become lower than a potential of the semiconductor substrate 1 (the second semiconductor region 5) at a portion below the photogate electrode PG with respect to electrons, and negative charge (electrons) is pulled in directions of the transfer electrodes TX5 and is accumulated in potential wells formed by the fourth semiconductor regions 11a to 11b. When a potential (ground potential) lower than the above-described positive potential is applied to the transfer electrodes TX5, potential barriers due to the transfer electrodes TX5 are generated, and electric charge generated in the semiconductor substrate 1 is not pulled into the fourth semiconductor regions 11a to 11b.

Figure 4:
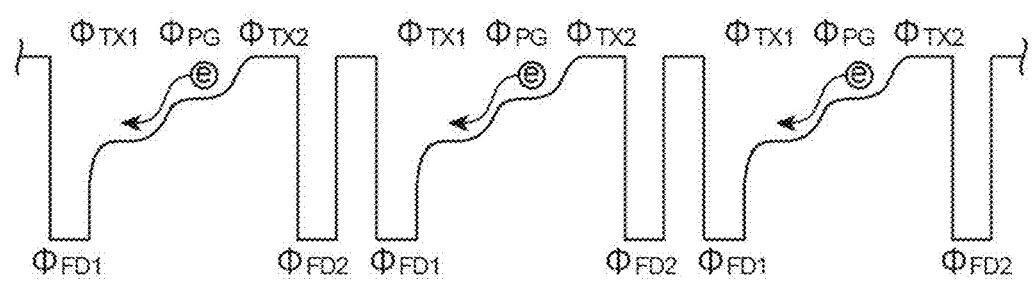
FIG. 4 is a diagram showing a potential distribution in the vicinity of a second main surface of a semiconductor substrate for explaining an accumulation operation of signal charge.
Figure 4:
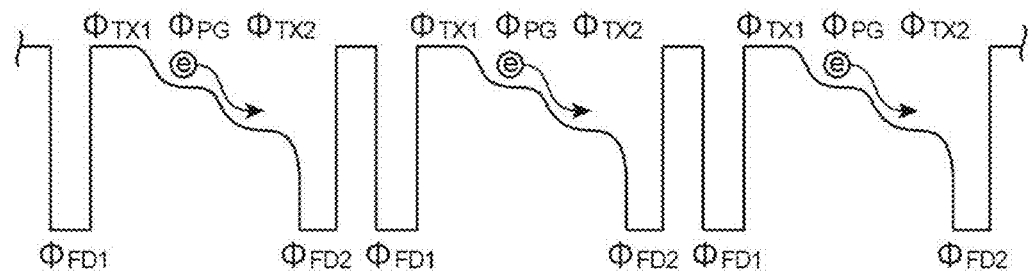
Figure 4:
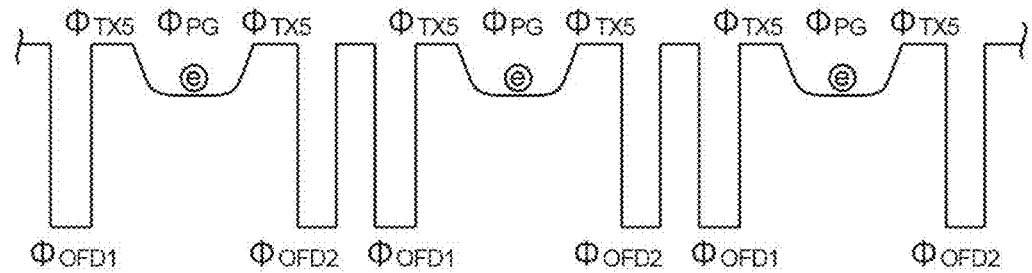
Figure 5:
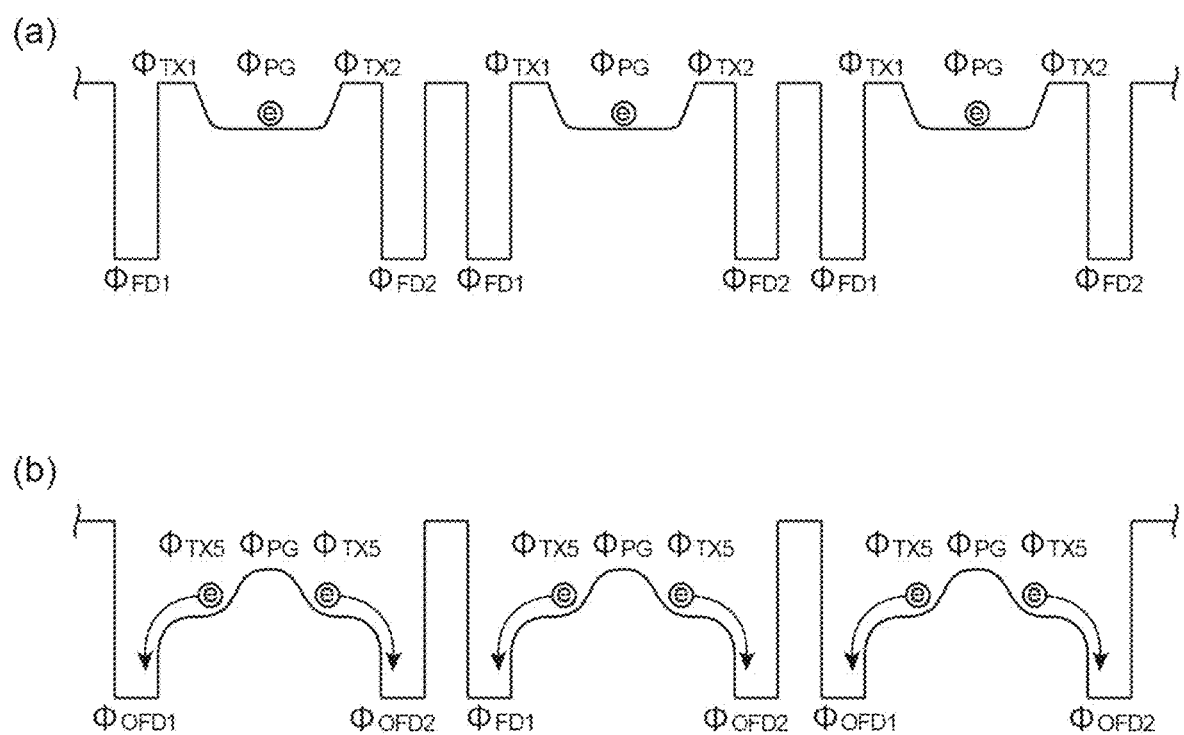
FIG. 5 is a diagram showing a potential distribution in the vicinity of the second main surface of the semiconductor substrate for explaining a discharge operation of unnecessary charge.

FIG. 4 is a diagram showing a potential distribution in the vicinity of the second main surface 1b of the semiconductor substrate 1 for explaining an accumulation operation of signal charge. FIG. 5 is a diagram showing a potential distribution in the vicinity of the second main surface 1b of the semiconductor substrate 1 for explaining a discharge operation of unnecessary charge. In FIGS. 4 and 5, a downward direction is a positive direction of a potential. FIGS. 4(a) and 4(b) show potential distributions in a transverse direction of a transverse cross section of FIG. 2, and FIG. 4(c) shows a potential distribution in a transverse direction of a transverse cross section of FIG. 3. FIG. 5(a) shows a potential distribution in a transverse direction of the transverse cross section of FIG. 2, and FIG. 5(b) shows a potential distribution in a transverse direction of the transverse cross section of FIG. 3.

FIGS. 4 and 5 show a potential $\phi_{TX1}$ in a region (the transfer gate 4a) just below the transfer electrode TX1, a potential $\phi_{TX2}$ in a region (the transfer gate 4b) just below the transfer electrode TX2, a potential $\phi_{TX5}$ in a region (the discharge gates 6a and 6b) just below the transfer electrode TX5, a potential $\phi_{PG}$ of the light receiving part 2 just below the photogate electrode PG, a potential $\phi_{FD1}$ of the third semiconductor region 9a, a potential $\phi_{FD2}$ of the third semiconductor region 9b, a potential $\phi_{OFD1}$ of the fourth semiconductor region 11a, and a potential $\phi_{OFD2}$ of the fourth semiconductor region 11b.

When the potentials ($\phi_{TX1}$, $\phi_{TX2}$, and $\phi_{TX5}$) in the regions just below the transfer electrodes TX1 and TX2 and the transfer electrode TX5 which are adjacent to the photogate electrode PG at the time of no bias are set as a reference potential, the potential $\phi_{PG}$ of the light receiving part 2 just below the photogate electrode PG is set higher than the reference potential. The potential $\phi_{PG}$ of the light receiving part 2 is higher than the potentials $\phi_{TX1}$, $\phi_{TX2}$, and $\phi_{TX5}$, and a potential distribution in this region has a downwardly concave shape in the drawing.

An accumulation operation of signal charge will be described with reference to FIG. 4. When a phase of the charge transfer signal applied to the transfer electrode TX1 is 0 degrees, a positive potential is applied to the transfer electrode TX1, and a potential of a reverse phase, that is, a potential having a phase of 180 degrees (ground potential), is applied to the transfer electrode TX2. In this case, as shown in FIG. 4(a), negative charge e generated in the light receiving part 2 flows into the potential well of the third semiconductor region 9a due to the potential $\phi_{TX1}$ of the region just below the transfer electrode TX1 being lowered.

On the other hand, the potential $\phi_{TX2}$ of the region just below the transfer electrode TX2 is not lowered, and electric charge does not flow into the potential well of the third semiconductor region 9b. In the third semiconductor regions 9a and 9b, since n-type impurities are added, the potential is recessed in a positive direction.

When a phase of the charge transfer signal applied to the transfer electrode TX2 is 0 degrees, a positive potential is applied to the transfer electrode TX2, and a potential of a reverse phase, that is, a potential having a phase of 180 degrees (ground potential), is applied to the transfer electrode TX1. In this case, as shown in FIG. 4(b), the negative charge e generated in the light receiving part 2 flows into the potential well of the third semiconductor region 9b due to the potential $\phi_{TX2}$ of the region just below the transfer electrode TX2 being lowered. On the other hand, the potential $\phi_{TX1}$ of the region just below the transfer electrode TX1 is not lowered, and electric charge does not flow into the potential well of the third semiconductor region 9a. Thereby, the signal charge is collected and accumulated in the potential well of the third semiconductor region 9b. As described above, here, a potential gradient is formed with respect to the light receiving part 2.

While charge transfer signals out of phase with each other by 180 degrees are applied to the transfer electrode TX1 and the transfer electrode TX2, a ground potential is applied to the transfer electrode TX5. Therefore, as shown in FIG. 4(c), the potential $\phi_{TX5}$ of the region just below the transfer electrode TX5 is not lowered, and electric charge does not flow into the potential wells of the fourth semiconductor regions 11a and 11b.

As described above, the signal charge is collected and accumulated in the potential wells of the third semiconductor regions 9a and 9b. The signal charge accumulated in the potential wells of the third semiconductor regions 9a and 9b are read out to the outside. Further, in the above-described example, a set of the transfer electrode TX1 and the transfer electrode TX2 has been described, and the same applies to a set of the transfer electrode TX3 and the transfer electrode TX4.

As described above, a state in which a predetermined potential is applied to the transfer electrodes TX1 to TX4, and the regions just below the transfer electrodes TX1 to TX4, that is, the transfer gates 4a to 4d, can transfer electric charge to the third semiconductor regions 9a to 9d may be referred to as a charge transfer state. Also, the transfer gates 4a to 4d being in a charge transfer state may be referred to as the transfer gates 4a to 4d being in an ON state.

Next, a discharge operation of unnecessary charge will be described with reference to FIG. 5. A ground potential is applied to the transfer electrode TX1 and the transfer electrode TX2 (further, the transfer electrode TX3 and the transfer electrode TX4). Therefore, as shown in FIG. 5(a), potentials $\phi_{TX1}$ and $\phi_{TX2}$ in the regions just below the transfer electrode TX1 and the transfer electrode TX2 are not lowered, and electric charge does not flow into the potential wells of the third semiconductor regions 9a and 9b.

On the other hand, a positive potential is applied to the transfer electrode TX5. In this case, as shown in FIG. 5(b), the negative charge e generated in the light receiving part 2 flows into the potential wells of the fourth semiconductor regions 11a and 11b due to the potential $\phi_{TX5}$ of the region just below the transfer electrode TX5 being lowered. As described above, unnecessary charge is collected in the potential wells of the fourth semiconductor regions 11a and 11b. The unnecessary charge collected in the potential wells of the fourth semiconductor regions 11a and 11b is discharged to the outside.

As described above, a state in which a predetermined potential is applied to the transfer electrodes TX5, and the regions just below the transfer electrodes TX5, that is, the discharge gates 6a and 6b, can transfer electric charge to the fourth semiconductor regions 11a and 11b may be referred to as a charge discharge state. Also, the discharge gates 6a and 6b being in the charge discharge state may be referred to as the discharge gates 6a and 6b being in an ON state.

Further, the photosensor 50 includes a reset transistor (not illustrated) provided in the sensor unit 52 (pixel unit RS). When a reset voltage is applied to the reset transistor, reset processing is executed. The reset voltage is a positive voltage with a potential of the photogate electrode PG as a reference. Thereby, the electric charge accumulated in the third semiconductor regions 9a to 9d and the like serving as the charge accumulation part is discharged to the outside, and it becomes a state in which electric charge is not accumulated.

The description is continued with reference to FIG. 1. The timing generator 53 generates a charge transfer signal S1 described above and provides the charge transfer signal S1 to each of the transfer electrodes TX1 to TX5. Also, the timing generator 53 generates a drive signal S2 of the light source 51. The timing generator 53 provides the generated drive signal S2 to the delay circuit 54.

Here, the charge transfer signal S1 and the drive signal S2 are associated (synchronized) with each other. The delay circuit 54 receives the drive signal S2 from the timing generator 53, generates a new drive signal S3 by applying a certain delay, and provides the drive signal S3 to the light source 51. The charge transfer signal S1 is associated with (synchronized with) the drive signal S3 via the drive signal S2. The light source 51 is driven by the drive signal S3 and outputs pulsed light. Further, the timing generator 53 and the delay circuit 54 may be integrated inside the sensor unit 52.

Figure 6:
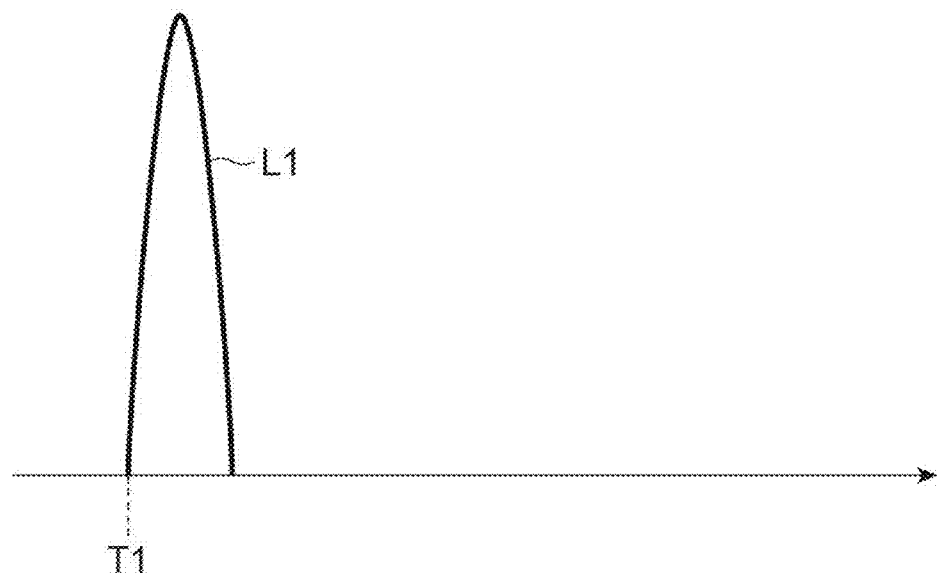
FIG. 6 is a graph showing a relationship between excitation light and fluorescence.
Figure 6:
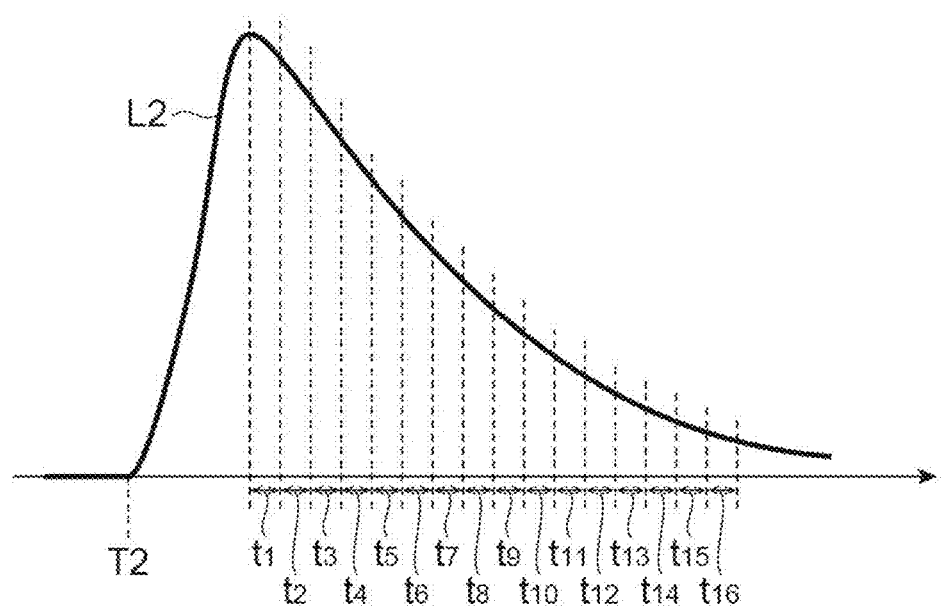

The photodetector 100 (photosensor 50) described above is used, for example, for measuring a fluorescence lifetime. In this case, as shown in FIG. 6, the object is irradiated with excitation light L1 which is pulsed light from the light source 51 at time T1, and the sensor unit 52 receives fluorescence L2 from the object excited by the excitation light L1. The fluorescence L2 is attenuated in a predetermined time while being incident on the sensor unit 52, for example, at time T2.

In the photosensor 50, a plurality of time ranges $t_k$ (k=1, 2, . . . , 16) are set for a predetermined period from a peak of the fluorescence L2, and the electric charge generated in the light receiving part 2 is distributed and transferred to the charge transfer gates 4a to 4d for each time range $t_k$ to be accumulated in each of the third semiconductor regions 9a to 9d serving as the charge accumulation parts. Therefore, the timing generator 53 generates the charge transfer signal S1 that is applied to the charge transfer gates 4a to 4d via the transfer electrodes TX1 to TX4.

As described above, here, since 16 time ranges $t_k$ are set with respect to the fluorescence L2, one charge transfer gate is in a charge transfer state (ON state) in different time ranges $t_k$ in each of four frames. As an example, in a first frame, the charge transfer gate 4a is in an ON state in a time range $t_1$, the charge transfer gate 4b is in an ON state in a time range $t_5$, the charge transfer gate 4c is in an ON state in a time range $t_9$, and the charge transfer gate 4d is in an ON state in a time range $t_{13}$. Also, in a second frame, the charge transfer gate 4a is in an ON state in a time range $t_2$, the charge transfer gate 4b is in an ON state in a time range $t_6$, the charge transfer gate 4c is in an ON state in a time range $t_{10}$, and the charge transfer gate 4d is in an ON state in a time range $t_{14}$.

Also, in a third frame, the charge transfer gate 4a is in an ON state in a time range $t_3$, the charge transfer gate 4b is in an ON state in a time range $t_7$, the charge transfer gate 4c is in an ON state in a time range $t_{11}$, and the charge transfer gate 4d is in an ON state in a time range $t_{15}$. Further, in a fourth frame, the charge transfer gate 4a is in an ON state in a time range $t_4$, the charge transfer gate 4b is in an ON state in a time range $t_8$, the charge transfer gate 4c is in an ON state in a time range $t_{12}$, and the charge transfer gate 4d is in an ON state in a time range $t_{14}$. Thereby, any of the charge transfer gates is in an ON state for the entire time range $t_k$, and electric charge is accumulated in the third semiconductor regions 9a to 9d.

Further, the time range $t_k$ may be set so that at least a pair of time ranges $t_n$ and $t_m$ (n and m are numbers different from each other among 1 to 16) partially overlap. Alternatively, the time range $t_k$ may be set so that at least the pair of time ranges $t_n$ and $t_m$ are separated from each other, and may be set so that a time range in which the discharge gates 6a and 6b are in an ON state is interposed between the time range $t_n$ and the time range $t_m$.

Figure 7:
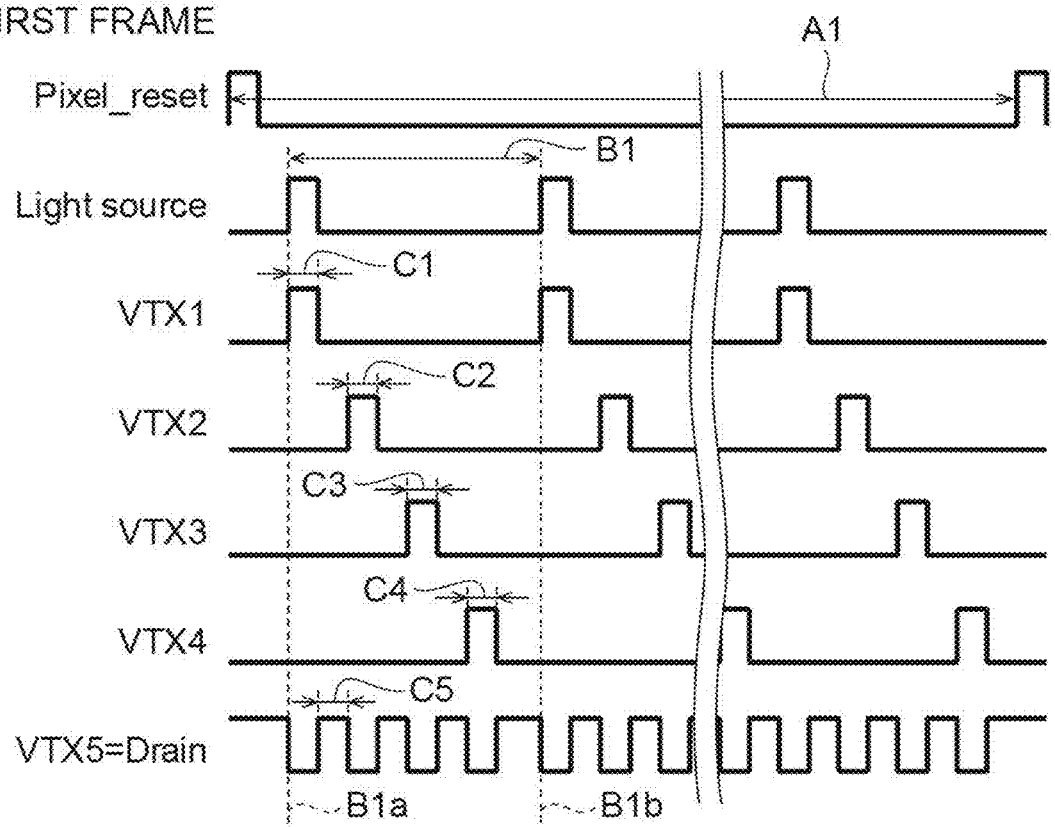
FIG. 7 is a timing chart of a signal generated and provided by a timing generator shown in FIG. 1.
Figure 7:
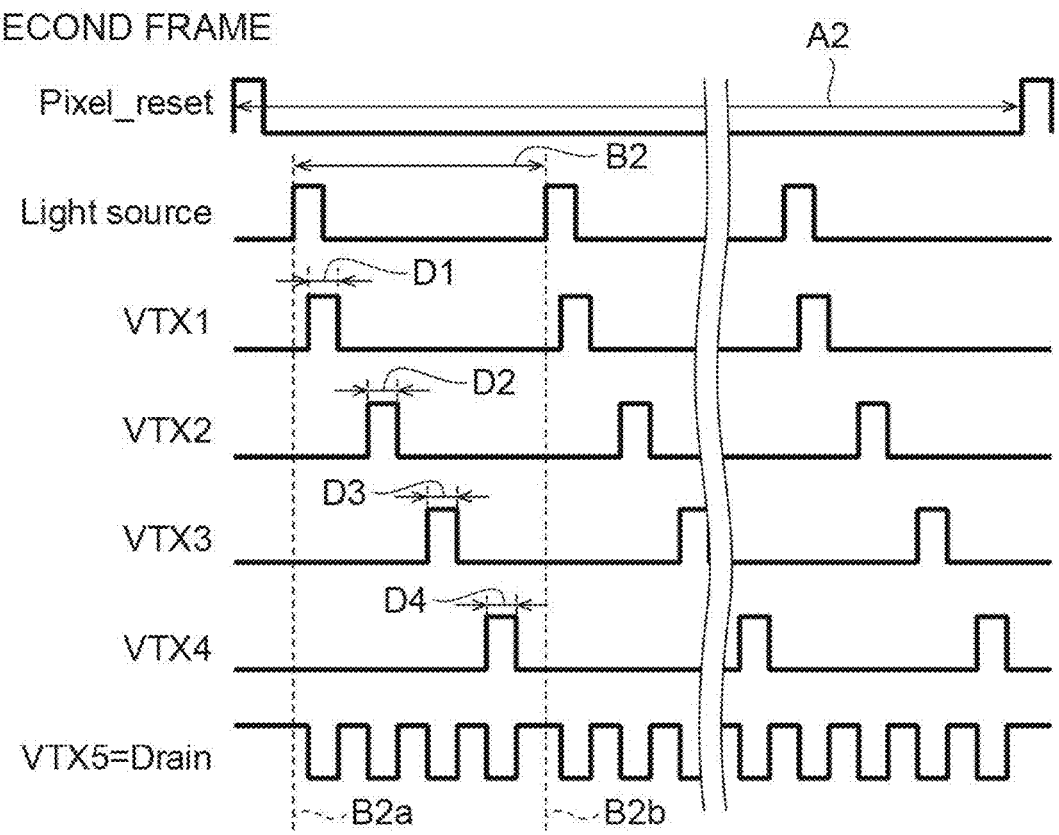
Figure 8:
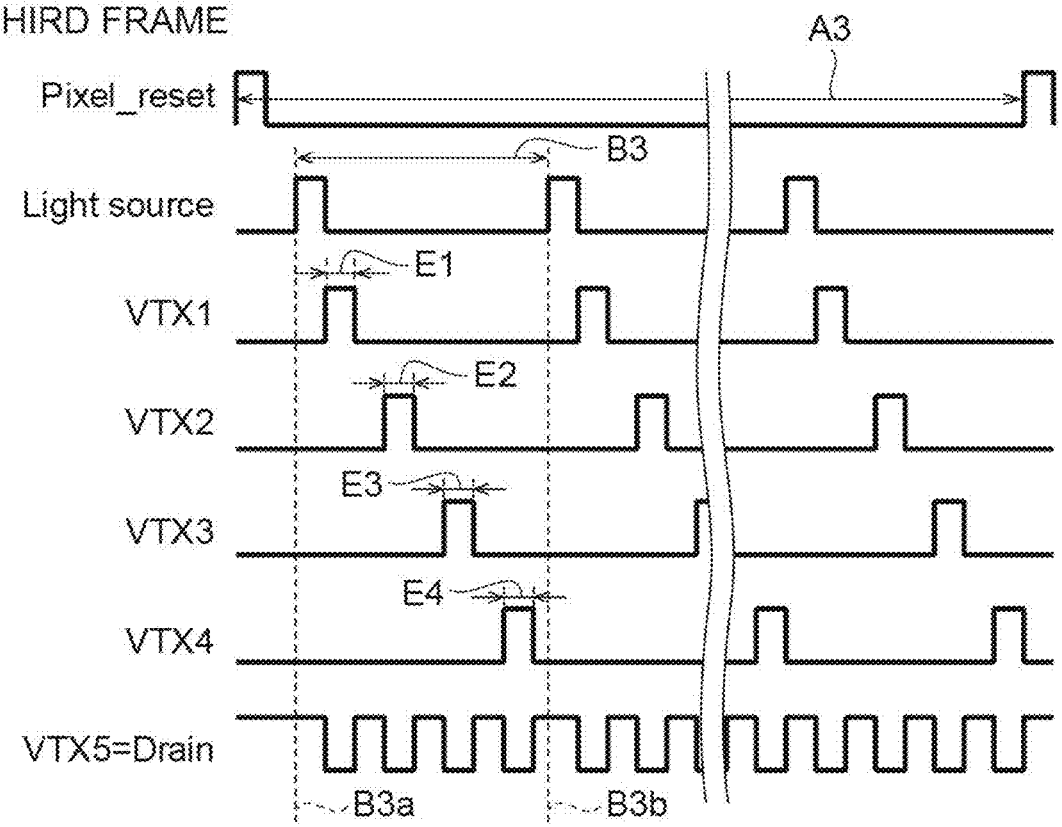
FIG. 8 is a timing chart of a signal generated and provided by the timing generator shown in FIG. 1.
Figure 8:
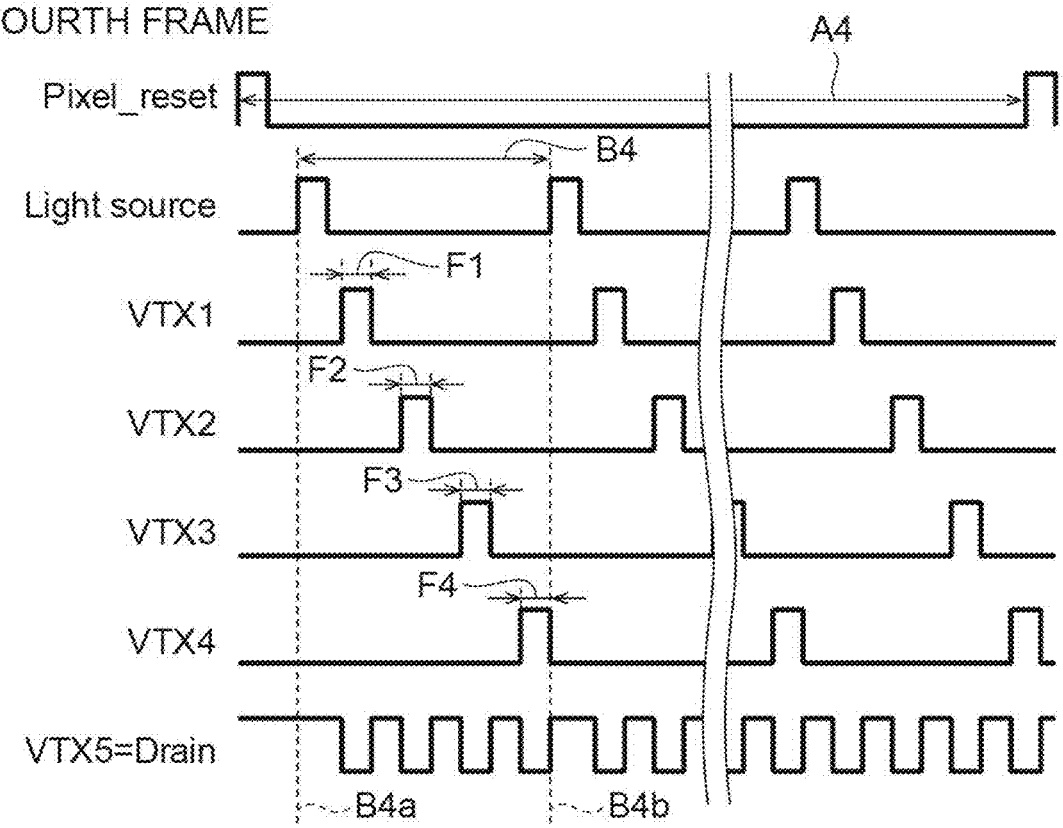

Next, a specific driving method of the photosensor 50 will be described. FIGS. 7 and 8 are timing charts of signals generated by the timing generator shown in FIG. 1. In FIGS.

7 and 8, Pixel_reset indicates a reset signal and indicates a timing at which reset processing is executed. Light source is the drive signal S2 provided to the light source 51 (the delay circuit 54) and indicates a timing of emitting the excitation light L1.

Also, VTX1 indicates a charge transfer signal applied to the charge transfer gate 4a via the transfer electrode TX1, VTX2 indicates a charge transfer signal applied to the charge transfer gate 4b via the transfer electrode TX2, VTX3 indicates a charge transfer signal applied to the charge transfer gate 4c via the transfer electrode TX3, and VTX4 indicates a charge transfer signal applied to the charge transfer gate 4d via the transfer electrode TX4. Further, VTX5=Drain indicates a charge transfer signal applied to the discharge gates 6a and 6b via the transfer electrodes TX5.

Further, FIG. 7(a) shows a first frame A1, FIG. 7(b) shows a second frame A2, FIG. 8(a) shows a third frame A3, and FIG. 8(b) shows a fourth frame A4. The frames A1 to A4 are temporally continuous in that order. Each of the frames A1 to A4 is defined as a period between a pair of reset processes as an example.

Also, the frame A1 includes a plurality of periods B1. Each of the periods B1 is defined as a period between emissions of the excitation light L1 in the frame A1. That is, a start time B1a of the period B1 is an emission time of one excitation light L1 in the frame A1, and an end time B1b of the period B1 is an emission time of next excitation light L1 of the one excitation light L1 in the frame A1. The frame A2 includes a plurality of periods B2. Each of the periods B2 is defined as a period between emissions of the excitation light L1 in the frame A2. That is, a start time B2a of the period B2 is an emission time of one excitation light L1 in the frame A2, and an end time B2b of the period B2 is an emission time of next excitation light L1 of the one excitation light L1 in the frame A2.

Also, the frame A3 includes a plurality of periods B3. Each of the periods B3 is defined as a period between emissions of the excitation light L1 in the frame A3. That is, a start time B3a of the period B3 is an emission time of one excitation light L1 in the frame A3, and an end time B3b of the period B3 is an emission time of next excitation light L1 of the one excitation light L1 in the frame A3. Further, the frame A4 includes a plurality of periods B4. Each of the periods B4 is defined as a period between emissions of the excitation light L1 in the frame A4. That is, a start time B4a of the period B4 is an emission time of one excitation light L1 in the frame A4, and an end time B4b of the period B4 is an emission time of next excitation light L1 of the one excitation light L1 in the frame A4.

Here, the periods B1 to B4 have the same length as each other, and time differences thereof from the start times of the frames A1 to A4 are also the same. Therefore, in the periods B1 to B4, when the start times B1a to B4a are made to match, the end times B1b to B4b also match (that is, the whole thereof overlaps).

In the period B1 belonging to the frame A1, first, the charge transfer signal VTX1 is applied to the charge transfer gate 4a via the transfer electrode TX1 so that the charge transfer gate 4a is brought into a charge transfer state (ON state) in a time range C1. Next, in the period B1, the charge transfer signal VTX2 is applied to the charge transfer gate 4b via the transfer electrode TX2 so that the charge transfer gate 4b is brought into an ON state in a time range C2. Next, in the period B1, the charge transfer signal VTX3 is applied to the charge transfer gate 4c via the transfer electrode TX3 so that the charge transfer gate 4c is brought into an ON state in a time range C3.

Thereafter, in the period B1, the charge transfer signal VTX4 is applied to the charge transfer gate 4d via the transfer electrode TX4 so that the charge transfer gate 4d is brought into an ON state in a time range C4. The frame A1 includes a plurality of (here, continuous) such periods B1.

Next, in the period B2 belonging to the frame A2, first, the charge transfer signal VTX1 is applied to the charge transfer gate 4a via the transfer electrode TX1 so that the charge transfer gate 4a is brought into an ON state in a time range D1. Next, in the period B2, the charge transfer signal VTX2 is applied to the charge transfer gate 4b via the transfer electrode TX2 so that the charge transfer gate 4b is brought into an ON state in a time range D2. Next, in the period B2, the charge transfer signal VTX3 is applied to the charge transfer gate 4c via the transfer electrode TX3 so that the charge transfer gate 4c is brought into an ON state in a time range D3.

Thereafter, in the period B2, the charge transfer signal VTX4 is applied to the charge transfer gate 4d via the transfer electrode TX4 so that the charge transfer gate 4d is brought into an ON state in a time range D4. The frame A2 includes a plurality of (here, continuous) such periods B2.

Next, in the period B3 belonging to the frame A3, first, the charge transfer signal VTX1 is applied to the charge transfer gate 4a via the transfer electrode TX1 so that the charge transfer gate 4a is brought into an ON state in a time range E1. Next, in the period B3, the charge transfer signal VTX2 is applied to the charge transfer gate 4b via the transfer electrode TX2 so that the charge transfer gate 4b is brought into an ON state in a time range E2. Next, in the period B3, the charge transfer signal VTX3 is applied to the charge transfer gate 4c via the transfer electrode TX3 so that the charge transfer gate 4c is brought into an ON state in a time range E3.

Thereafter, in the period B3, the charge transfer signal VTX4 is applied to the charge transfer gate 4d via the transfer electrode TX4 so that the charge transfer gate 4d is brought into an ON state in a time range E4. The frame A3 includes a plurality of (here, continuous) such periods B3.

Further, in the period B4 belonging to the frame A4, first, the charge transfer signal VTX1 is applied to the charge transfer gate 4a via the transfer electrode TX1 so that the charge transfer gate 4a is brought into an ON state in a time range F1. Next, in the period B4, the charge transfer signal VTX2 is applied to the charge transfer gate 4b via the transfer electrode TX2 so that the charge transfer gate 4b is brought into an ON state in a time range F2. Next, in the period B4, the charge transfer signal VTX3 is applied to the charge transfer gate 4c via the transfer electrode TX3 so that the charge transfer gate 4c is brought into an ON state in a time range F3.

Thereafter, in the period B4, the charge transfer signal VTX4 is applied to the charge transfer gate 4d via the transfer electrode TX4 so that the charge transfer gate 4d is brought into an ON state in a time range F4. The frame A4 includes a plurality of (here, continuous) such periods B4. Further, the time ranges C1 to C4, the time ranges D1 to D4, the time ranges E1 to E4, and the time ranges F1 to F4 each have the same length as each other.

As described above, the timing generator 53 generates the charge transfer signal so that the charge transfer gate is brought into a charge transfer state in a first time range of a first period belonging to an n-th (n is an integer of 1 or more) frame and the charge transfer gate is brought into a charge transfer state in a second time range of a second period belonging to an m-th (m is an integer of 1 or more different from n) frame.

Here, as an example, n and m are integers that are continuous with each other (that is, m=n±1). Therefore, as an example, when it is assumed that n=1 and m=2, the timing generator 53 generates the charge transfer signal VTX1 so that the charge transfer gate 4a is brought into an ON state in the time range (the first time range) C1 of the period (the first period) B1 belonging to the frame A1 and the charge transfer gate 4a is brought into an ON state in the time range (the second time range) D1 of the period (the second period) B2 belonging to the frame A2. The same applies to other combinations of n and m.

On the other hand, the timing generator 53 also generates the charge transfer signals VTX2 to VTX4 for the charge transfer gates 4b to 4c in the same manner. As an example, when it is assumed that n=1 and m=2 and focused on the charge transfer gate 4b, the timing generator 53 generates the charge transfer signal VTX2 so that the charge transfer gate 4b is brought into an ON state in the time range (the third time range) C2 of the period (the first period) B1 belonging to the frame A1, and the charge transfer gate 4b is brought into an ON state in the time range (the fourth time range) D2 of the period (the second period) B2 belonging to the frame A2. The same applies when the first charge transfer gate and the second charge transfer gate are the charge transfer gates 4c and 4d.

Here, when a start time of the first period and a start time of the second period are made to match, the timing generator 53 generates the charge transfer signals VTX1 to VTX4 so that a part of the first time range and a part of the second time range overlap each other. Also, when the start time of the first period and the start time of the second period are made to match, the timing generator 53 generates the charge transfer signals VTX1 to VTX4 so that a part of the third time range and a part of the fourth time range overlap each other.

As an example, when it is assumed that n=1 and m=2, the first time range is the time range C1, and the second time range is the time range D1, the timing generator 53 generates the charge transfer signal VTX1 so that only parts of the time range (the first time range) C1 in the period B1 and the time range (the second time range) D1 in the period B2 overlap when the start time B1a of the period (the first period) B1 belonging to the frame A1 and the start time B2a of the period (the second period) B2 belonging to the frame A2 are made to match. Further, an amount of deviation between the time range C1 and the time range D1 is a time of ½ of the time ranges C1 and D1 as an example.

Also, when it is assumed that n=1 and m=2, the third time range is the time range C2, and the fourth time range is the time range D2, the timing generator 53 generates the charge transfer signal VTX2 so that only parts of the time range (the third time range) C2 in the period B1 and the time range (the fourth time range) D2 in the period B2 overlap when the start time B1a of the period (the first period) B1 belonging to the frame A1 and the start time B2a of the period (the second period) B2 belonging to the frame A2 are made to match. Here, an amount of deviation between the time range C2 and the time range D2 is also a time of ½ of the time ranges C2 and D2 as an example. The same applies to other combinations of n and m and combinations of time ranges.

As described above, among the plurality of charge transfer gates 4a to 4d, if the charge transfer gate 4a is used as the first charge transfer gate and the charge transfer gate 4b is used as the second charge transfer gate, the above example can be paraphrased as follows. That is, the timing generator 53 generates the charge transfer signal VTX1 so that the first charge transfer gate of the first charge transfer gate and the second charge transfer gate is brought into an ON state in the first time range (here, the time range C1) which is one of the pair of time ranges overlapping each other, and the first charge transfer gate of the first charge transfer gate and the second charge transfer gate is brought into an ON state in the second time range (here, the time range D1) which is the other of the pair of time ranges overlapping each other.

At this time, the timing generator 53 further generates the charge transfer signal VTX2 so that the second charge transfer gate is brought into an ON state in the third time range (here, the time range C2) which is one of another pair of time ranges overlapping each other, and the second charge transfer gate is brought into an ON state in the fourth time range (here, the time range D2) which is the other of another pair of time ranges overlapping each other. Further, which of the charge transfer gates 4a to 4d to be used as the first charge transfer gate and the second charge transfer gate is arbitrary.

Further, an amount of deviation during the ON periods such as an amount of deviation between the time range C1 and the time range D1 and an amount of deviation between the time range C2 and the time range D2 is not limited to ½ of each time range C1, C2, D1, D2, or the like, and is arbitrary such as ¼, ⅛, or ¾ thereof.

Also, the timing generator 53 generates the charge transfer signal so that the charge transfer gate is brought into a charge transfer state in an overlapping time range when a start time of a period is made to match over a plurality of the periods in one frame. As an example, the timing generator 53 generates the charge transfer signal VTX1 so that the charge transfer gate 4a is brought into an ON state in the overlapping time range C1 when the start time B1a of the period B1 is made to match over a plurality of the periods B1 in the frame A1. Thereby, integration of electric charge is performed in the charge accumulation part. The same applies to other frames, periods, and charge transfer gates.

As described above, in the photosensor 50 and the driving method for the photosensor 50, the charge transfer signal applied to the charge transfer gate for transferring the electric charge generated in the light receiving part 2 is generated so that the charge transfer gate (for example, the charge transfer gate 4a) is brought into an ON state in the first time range (for example, the time range C1) of the first period (for example, the period B1) belonging to the n-th frame (for example, the frame A1), and the charge transfer gate (for example, the charge transfer gate 4a) is brought into an ON state in the second time range (for example, the time range D1) of the second period (for example, the period B2) belonging to the m-th frame (for example, the frame A2).

The first time range and the second time range are ON periods of the charge transfer gate. Then, when the start time of the first period (for example, the start time B1a) and the start time of the second period (for example, B2a) are made to match, a part of the first time range and a part of the second time range overlap each other. In this way, if the ON periods of the charge transfer gate are made to overlap between frames different from each other, at least a phenomenon that occurs repeatedly corresponding to each frame (for example, the fluorescence L2 according to the excitation light L1 irradiated in each period) can be caught at a time interval (for example, ½ of the time ranges C1 and D1) according to an amount of deviation during the ON periods. That is, a time resolution can be improved and a detection accuracy can be improved.

Further, the device configuration described in Patent Literature 1 can be considered to be feasible if there is only one light receiving part (single element) as described above, but when the light receiving parts are disposed one-dimensionally or two-dimensionally, the circuit scale will become enormous and the feasibility will become poor. On the other hand, in the photosensor 50 according to the present embodiment, since highly accurate detection is achieved by timing control of the charge transfer gates 4a to 4d, even when a plurality of light receiving parts 2 are provided in an array, the sensor structure becoming complicated can be avoided, and as a result, feasibility is secured.

Also, in the photosensor 50, the n-th frame and the m-th frame are frames that are continuous with each other. As described above, a configuration in which ON periods partially overlap between the frames that are continuous with each other (for example, between frames A1 and A2) is effective for the phenomenon that occurs repeatedly with slight changes. This is because the change in the phenomenon between the frames is relatively small compared to a case in which an interval between the frames whose ON periods partially overlap is large.

Also, in the photosensor 50, the timing generator 53 generates the charge transfer signal (for example, the charge transfer signal VTX1) so that the first charge transfer gate (for example, the charge transfer gate 4a) is brought into an ON state in an overlapping time range (for example, the time range C1) when a start time (for example, the start time B1a) of a period is made to match over a plurality of the periods (for example, the periods B1) in one frame (for example, the frame A1). In this case, integration of electric charge can be performed in one frame.

Also, in the photosensor 50, the timing generator 53 generates the charge transfer signal (for example, the charge transfer signal VTX1) so that one of the first charge transfer gate (for example, the charge transfer gate 4a) and the second charge transfer gate (for example, the charge transfer gate 4b) is brought into an ON state in the first time range (for example, the time range C1), and the one of the first charge transfer gate and the second charge transfer gate is brought into an ON state in the second time range (for example, the time range D1). As described above, in the photosensor 50 including the plurality of charge transfer gates 4a to 4d, at least ON periods of the same charge transfer gate may be made to overlap in the n-th frame and the m-th frame.

Also, in the photosensor 50, the timing generator 53 further generates the charge transfer signal (for example, the charge transfer signal VTX2) to be applied to the second charge transfer gate so that the second charge transfer gate (for example, the charge transfer gate 4b) is brought into an ON state in the third time range (for example, the time range C2) of the first period (for example, the period B1), and the second charge transfer gate is brought into an ON state in the fourth time range (for example, the time range D2) of the second period (for example, the period B2). Then, when the start time (for example, the start time B1a) of the first period and the start time (for example, the start time B2a) of the second period are made to match, a part of the third time range and a part of the fourth time range overlap each other. As described above, when ON periods of the charge transfer gates are made to partially overlap for the photosensor 50 including the plurality of charge transfer gates, the number of frames can be reduced while improving a time resolution thereof.

Further, in the photosensor 50, the timing generator 53 further generates the drive signal S2 for the light source 51 to periodically output the excitation light L1. Start times (for example, the start times B1a and B2a) of the first period (for example, the period B1) and the second period (for example, the period B2) are synchronized with the timing at which the light source 51 outputs the excitation light L1. Therefore, a time resolution can be improved and a detection accuracy can be improved for the phenomenon (for example, the fluorescence L2) that occurs repeatedly due to the excitation light L1 from the light source 51.

Further, also for the photosensor 50 according to the first embodiment, ON periods of the discharge gates 6a and 6b can be controlled similarly to a photosensor according to a second embodiment to be described later. That is, referring to FIG. 7(a) as an example, the timing generator 53 generates a charge transfer signal VTX5=Drain so that the discharge gates 6a and 6b are brought into an ON state in a time range C5 (seventh time range) between the time range C1 (fifth time range) which is an ON period of the charge transfer gate 4a and the time range C2 (sixth time range) which is an ON period of the charge transfer gate 4b and is separated from the time range C1. When it is assumed that the fifth time range is the above-described first time range and the sixth time range is the above-described third time range, the seventh time range can be regarded as a time range between the first time range and the third time range. The same applies to a modified example according to the first embodiment below. According to this, as a result of being able to discharge unread electric charge generated in the light receiving part 2, the detection accuracy can be further improved.

Modified Example According to First Embodiment

The first embodiment described above has described one embodiment of the present disclosure. Therefore, the present disclosure is not limited to the above-described embodiment and may be arbitrarily modified.

Figure 9:
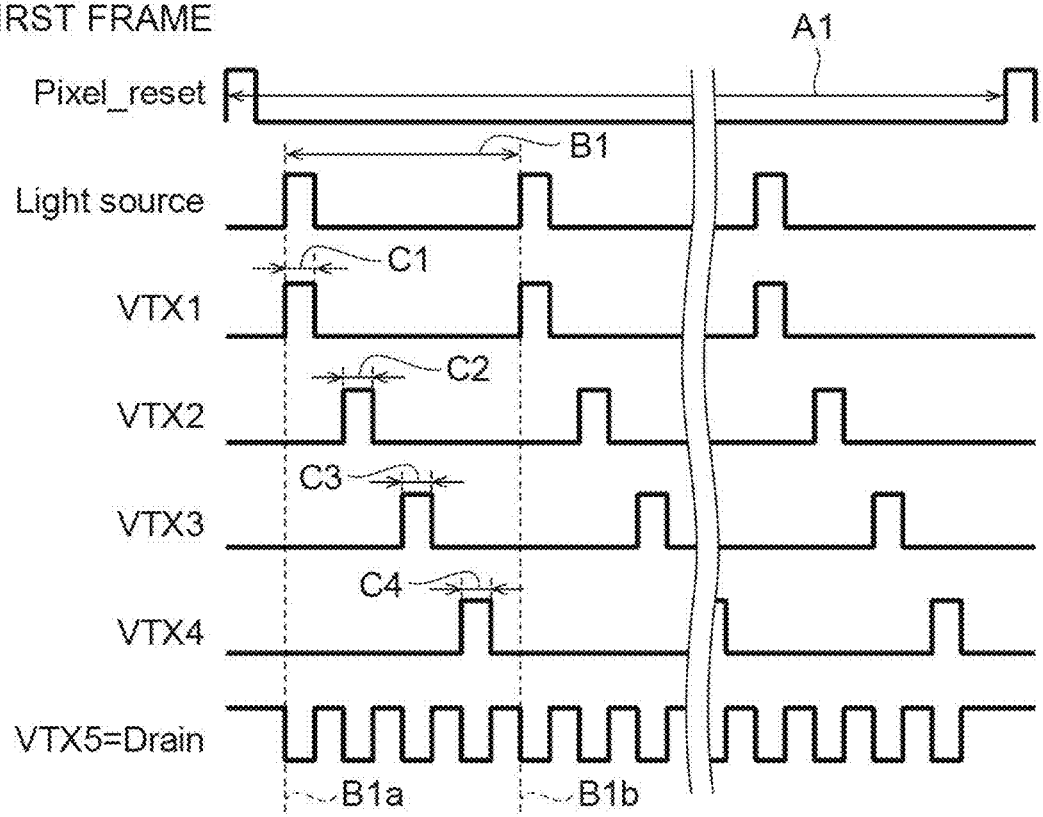
FIG. 9 is a diagram showing a timing chart according to a modified example of the first embodiment.
Figure 9:
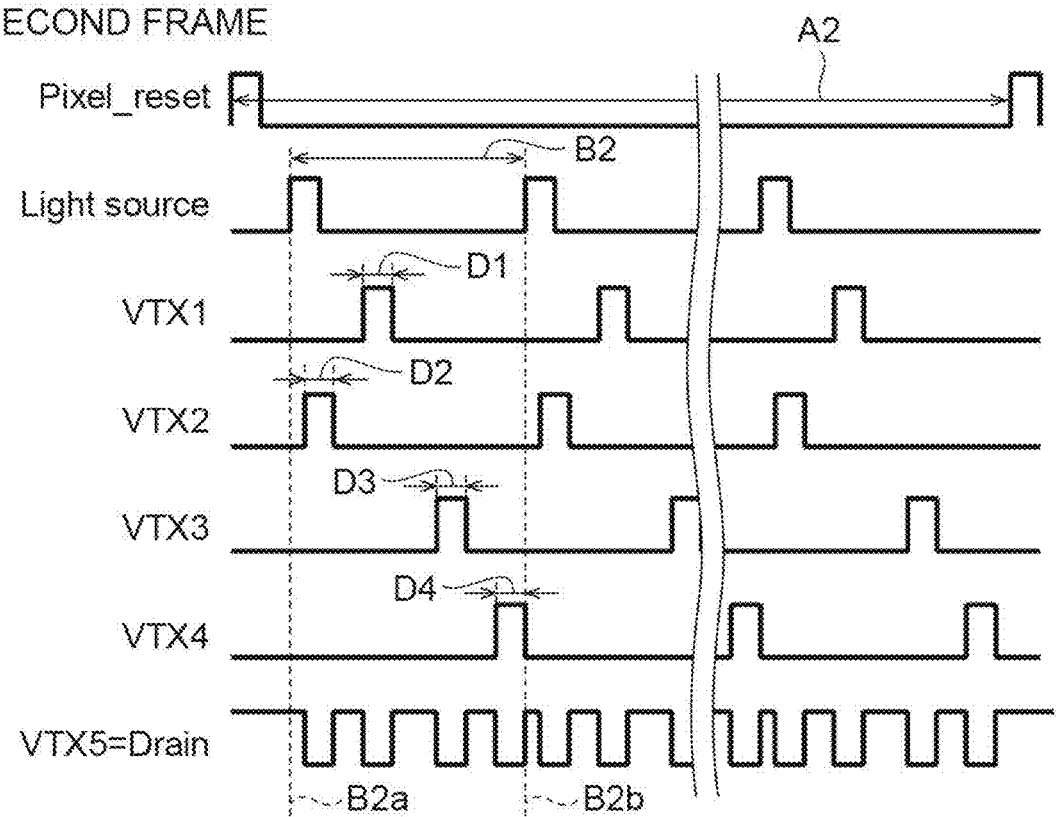

FIG. 9 is a diagram showing a timing chart according to a modified example of the first embodiment. As shown in FIG. 9, in this example, when the start time B1a of the period B1 and the start time B2a of the period B2 are made to match, only parts of the time range C1 and the time range D2 overlap. That is, in this example, when the charge transfer gate 4a is used as the first charge transfer gate and the charge transfer gate 4b is used as the second charge transfer gate, it can be paraphrased as follows.

That is, in this example, the timing generator 53 generates the charge transfer signals VTX1 and VTX2 so that one of the first charge transfer gate and the second charge transfer gate is brought into an ON state in the first time range (here, the time range C1) which is one of the pair of time ranges overlapping each other, and the other of the first charge transfer gate and the second charge transfer gate is brought into an ON state in the second time range which is the other of the pair of time ranges overlapping each other. As described above, in the photosensor 50 including the plurality of charge transfer gates 4a to 4d, at least ON periods of the charge transfer gates different from each other may be made to overlap in the n-th frame and the m-th frame.

Further, in the above-described embodiment, ON periods (time ranges C3 and D3) of the charge transfer gate 4c overlap each other and ON periods (time ranges C4 and D4) of the charge transfer gate 4d also overlap each other over a plurality of frames. However, in the example of FIG. 9, ON periods of the charge transfer gate 4c do not overlap each other, and ON periods of the charge transfer gate 4d do not overlap each other. As described above, in the photosensor 50, at least a pair of ON periods of at least the charge transfer gates 4a to 4d need only be overlapped between at least a pair of frames.

For example, in the first embodiment described above, a case in which the timing generator 53 generates the charge transfer signal so that ON periods of a specific charge transfer gate overlap between frames that are continuous with each other (that is, in a case of m=n±1) has been described. However, an aspect of generating a charge transfer signal is not limited thereto, and the timing generator 53 may generate a charge transfer signal so that ON periods of a specific charge transfer gate overlap between a pair of frames that are separated from each other while interposing another frame therebetween.

As an example of this case, when it is assumed that n=2 and m=4, the first time range is the time range D3, and the second time range is the time range F3, the timing generator 53 generates the charge transfer signal VTX3 so that only parts of the time range (the first time range) D3 in the period B2 and the time range (the second time range) F3 in the period B4 overlap when the start time B2a of the period (the first period) B2 belonging to the frame A2 and the start time B4a of the period (the second period) B4 belonging to the frame A4 are made to match. In this case, ON periods of the charge transfer gate 4c partially overlap between the frames A2 and the frame A4.

As described above, in the photosensor 50, ON periods of at least one charge transfer gate need only partially overlap at least once between at least two frames among the plurality of frames. Further, ON periods of a specific charge transfer gate may be partially overlapped between three or more frames.

Also, in the first embodiment, a case in which the photodetector 100 is used for measuring a fluorescence lifetime has been exemplified, but it can also be applied to another phenomenon. When the photodetector 100 is applied to a phenomenon that does not require irradiation of the excitation light L1, the periods B1 to B4 may not be synchronized with the timing at which the light source 51 outputs the excitation light L1.

Also, in the first embodiment described above, a configuration in which the photosensor 50 includes four charge transfer gates 4a to 4c for each of the pixel units RS has been described, but the photosensor 50 may include at least one charge transfer gate for each of the pixel units RS (for example, eight charge transfer gates may be included).

Also, the frames A1 to A4 are not limited to a case of being defined as the period between a pair of reset processes, and may be arbitrarily set. For example, the frames A1 to A4 may be set with reading of signals from the charge accumulation part (the third semiconductor region 9a to 9d) as a reference, and one image may be set as one frame when the photosensor 50 is a motion sensor. Further, the photosensor 50 and the driving method for the photosensor 50 according to the first embodiment may also be used for detecting a non-repeating phenomenon other than a phenomenon that occurs repeatedly.

Second Embodiment

Figure 10:
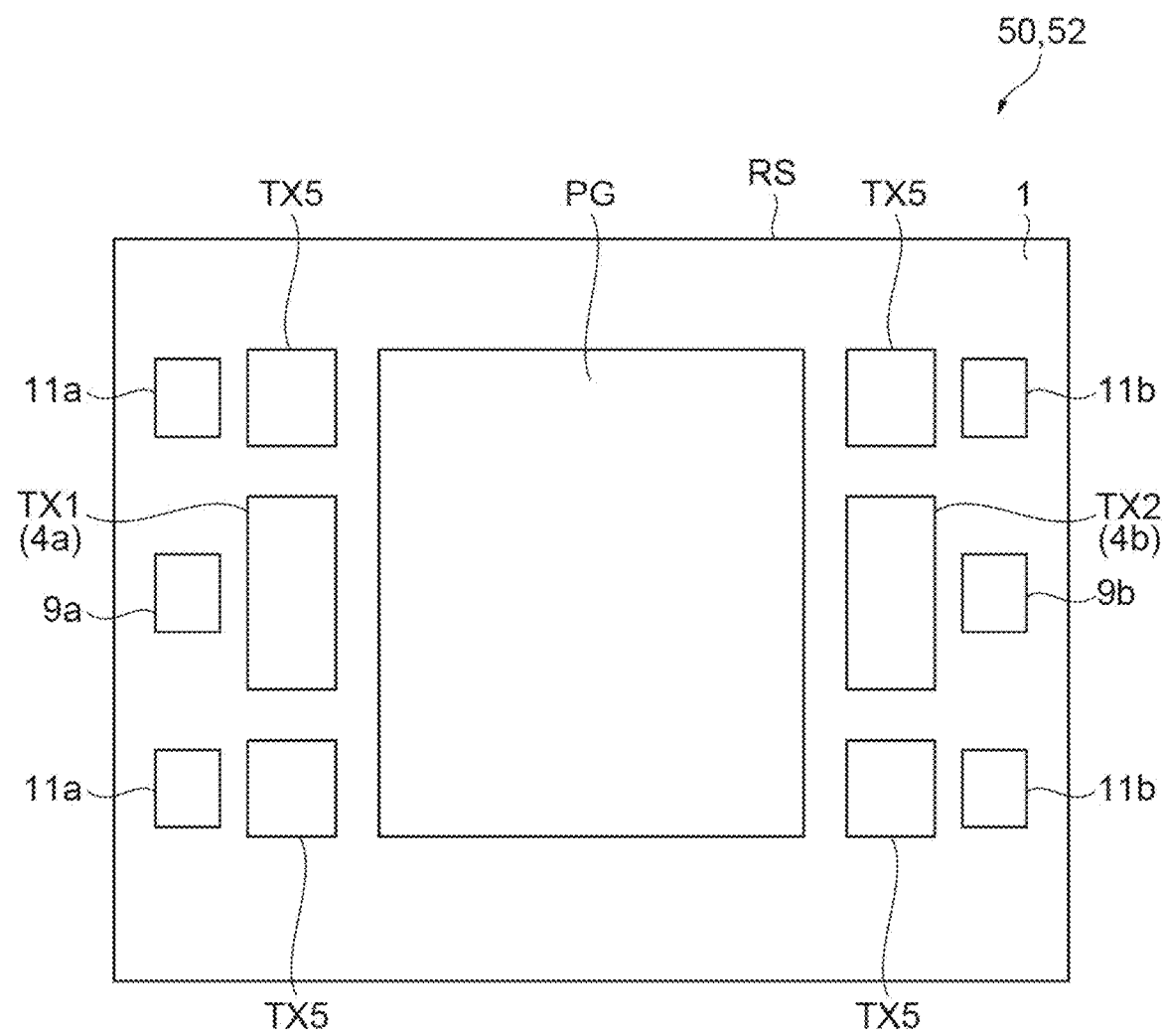
FIG. 10 is a plan view showing a part (pixel unit of a photosensor) of a photodetector according to a second embodiment.

Next, a second embodiment will be described. FIG. 10 is a plan view showing a part (a pixel unit of a photosensor) of a photodetector according to the second embodiment. An overall configuration of the photodetector according to the second embodiment is the same as that of the photodetector 100 according to the first embodiment. The photodetector according to the second embodiment is different from the first embodiment in terms of a photosensor 50 thereof including two charge transfer gates 4a and 4b for each of pixel units RS, a charge transfer signal generated by a timing generator 53, and a driving method. In FIG. 10, transfer electrodes TX1 and TX2 corresponding to the two charge transfer gates 4a and 4b are shown.

Figure 11:
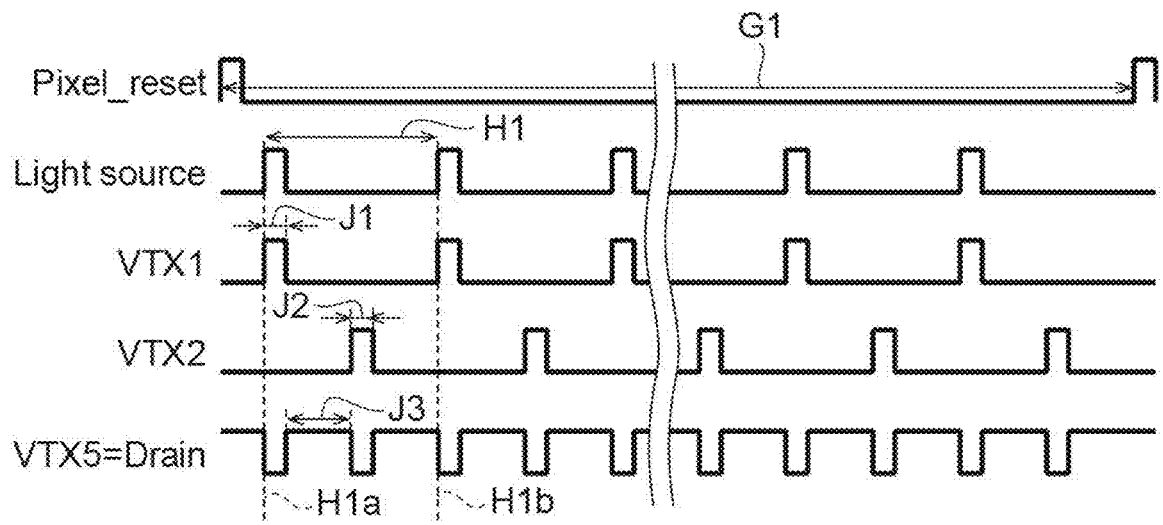
FIG. 11 is a timing chart of a signal generated by a timing generator according to the second embodiment.
Figure 11:
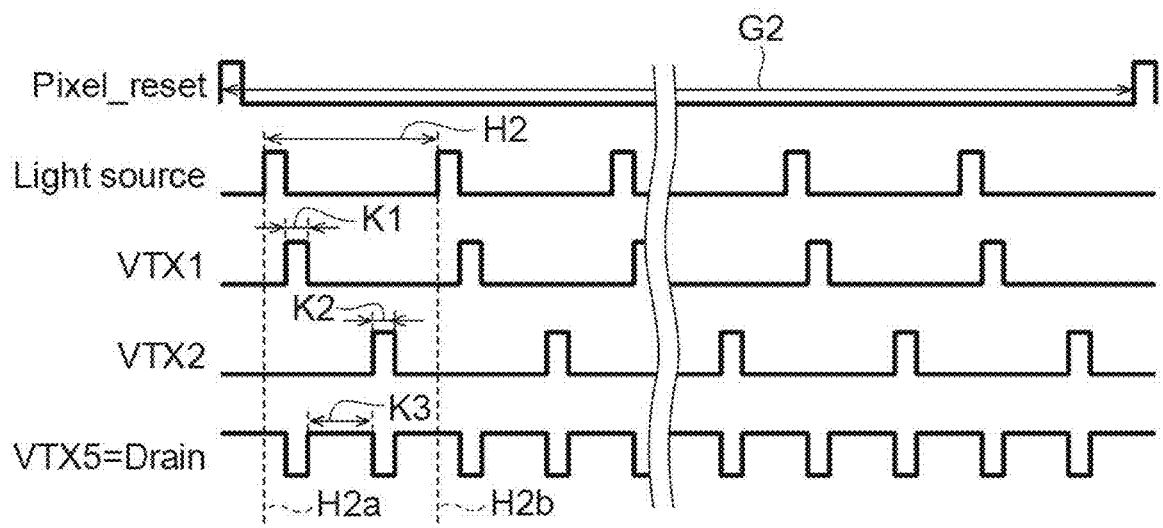
Figure 12:
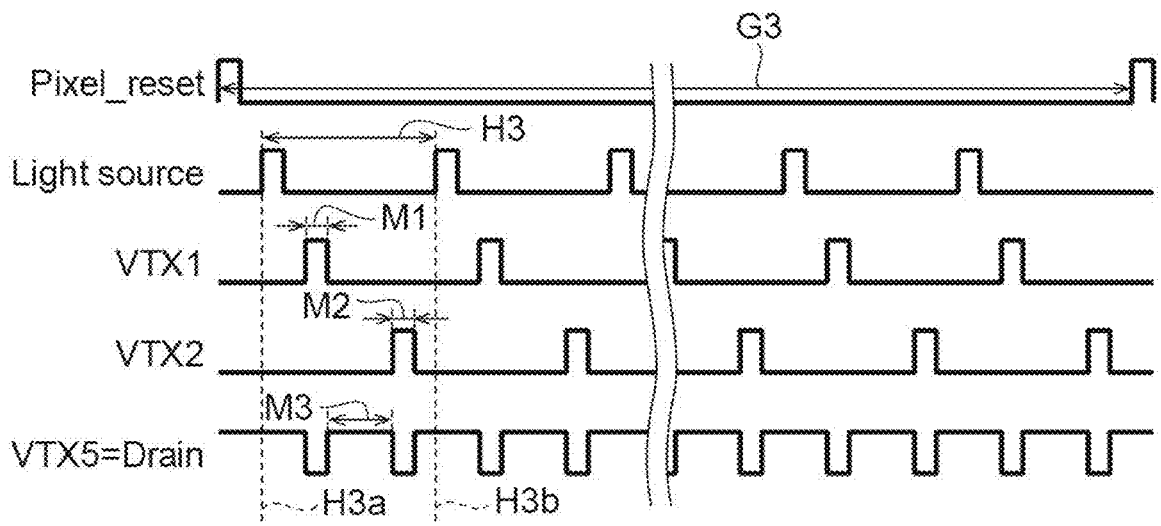
FIG. 12 is a timing chart of a signal generated by the timing generator according to the second embodiment.
Figure 12:
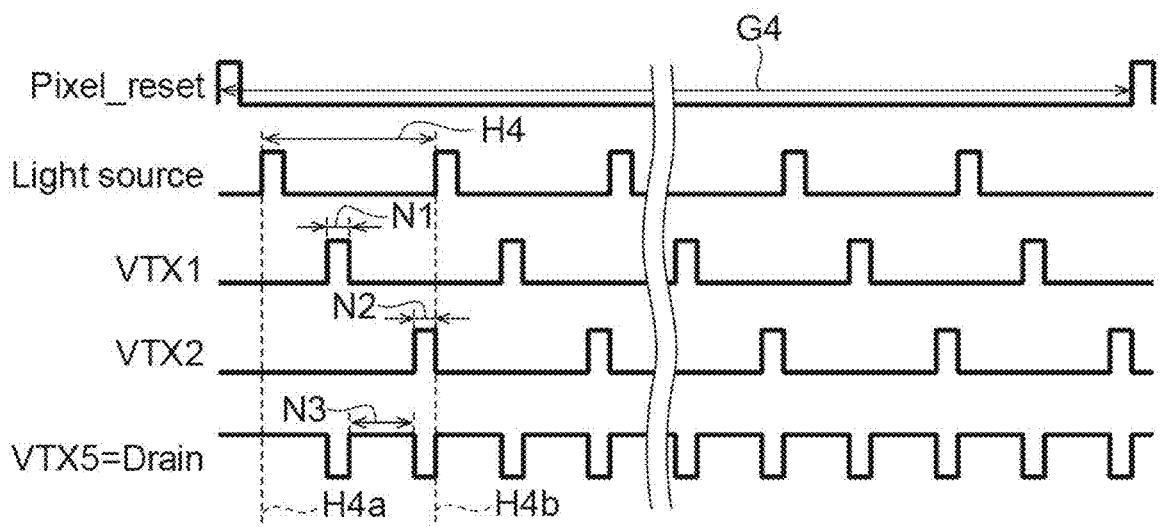

FIGS. 11 and 12 are timing charts according to the second embodiment. FIG. 11(a) shows a first frame G1, FIG. 11(b) shows a second frame G2, FIG. 11(a) shows a third frame G3, and FIG. 12(b) shows a fourth frame G4. The frames G1 to G4 are temporally continuous in that order. Each of the frames G1 to G4 is defined as a period between a pair of reset processes as an example.

The frame G1 includes a plurality of periods H1. The periods H1 are each defined as a period between emissions of excitation light L1 (in a case of fluorescence lifetime measurement) in the frame G1. That is, a start time H1a of the period H1 is an emission time of one excitation light L1 in the frame G1, and an end time H1b of the period H1 is an emission time of next excitation light L1 of the one excitation light L1 in the frame G1. The frame G2 includes a plurality of periods H2. The periods H2 are each defined as a period between emission of the excitation light L1 in the frame G2. That is, a start time H2a of the period H2 is an emission time of one excitation light L1 in the frame G2, and an end time H2b of the period H2 is an emission time of next excitation light L1 of the one excitation light L1 in the frame G2.

Also, the frame G3 includes a plurality of periods H3. The periods H3 are each defined as a period between emissions of the excitation light L1 in the frame G3. That is, a start time H3a of the period H3 is an emission time of one excitation light L1 in the frame G3, and an end time H3b of the period H3 is an emission time of next excitation light L1 of the one excitation light L1 in the frame G3. Further, the frame G4 includes a plurality of periods H4. The periods H4 are each defined as a period between emissions of the excitation light L1 in the frame G4. That is, a start time H4a of the period H4 is an emission time of one excitation light L1 in the frame G4, and an end time H4b of the period H4 is an emission time of next excitation light L1 of the one excitation light L1 in the frame G4.

Here, the periods H1 to H4 have the same length as each other, and time differences thereof from the start times of the frames G1 to G4 are also the same. Therefore, in the periods H1 to H4, when the start times H1a to H4a are made to match, the end times H1b to H4b also match (that is, the whole thereof overlaps).

In the period H1 belonging to the frame G1, first, a charge transfer signal VTX1 is applied to the charge transfer gate 4a via the transfer electrode TX1 so that the charge transfer gate 4a is brought into a charge transfer state (ON state) in a time range J1. Next, in the period H1, a charge transfer signal VTX2 is applied to the charge transfer gate 4b via the transfer electrode TX2 so that the charge transfer gate 4b is brought into an ON state in a time range J2. On the other hand, in the period H1, a charge transfer signal VTX5=Drain is applied to discharge gates 6a and 6b via transfer electrodes TX5 so that the discharge gates 6a and 6b are brought into an ON state in a time range J3 between the time range J1 and the time range J2. The frame G1 includes a plurality of (here, continuous) such periods H1.

Here, as an example, an end time of the time range J1 and a start time of the time range J3 match, and an end time of the time range J3 and a start time of the time range J2 match.

That is, here, the discharge gates 6a and 6b are in an ON state in the entire time range between the time range J1 in which the charge transfer gate 4a is in an ON state and the time range J2 in which the charge transfer gate 4b is in an ON state.

Next, in the period H2 belonging to the frame G2, first, the charge transfer signal VTX1 is applied to the charge transfer gate 4a via the transfer electrode TX1 so that the charge transfer gate 4a is brought into an ON state in a time range K1. Next, in the period H2, the charge transfer signal VTX2 is applied to the charge transfer gate 4b via the transfer electrode TX2 so that the charge transfer gate 4b is brought into an ON state in a time range k2. On the other hand, in the period H2, the charge transfer signal VTX5=Drain is applied to the discharge gate 6a and 6b via the transfer electrodes TX5 so that the discharge gates 6a and 6b are brought into an ON state in s time range K3 between the time range K1 and the time range K2. The frame G2 includes a plurality of (here, continuous) such periods H2.

Here, as an example, an end time of the time range K1 and a start time of the time range K3 match, and an end time of the time range K3 and a start time of the time range K2 match. That is, here, the discharge gates 6a and 6b are in an ON state in the entire time range between the time range K1 in which the charge transfer gate 4a is in an ON state and the time range K2 in which the charge transfer gate 4b is in an ON state.

Next, in the period H3 belonging to the frame G3, first, the charge transfer signal VTX1 is applied to the charge transfer gate 4a via the transfer electrode TX1 so that the charge transfer gate 4a is brought into an ON state in a time range M1. Next, in the period H3, the charge transfer signal VTX2 is applied to the charge transfer gate 4b via the transfer electrode TX2 so that the charge transfer gate 4b is brought into an ON state in a time range M2. On the other hand, in the period H3, the charge transfer signal VTX5=Drain is applied to the discharge gates 6a and 6b via the transfer electrodes TX5 so that the discharge gates 6a and 6b are brought into an ON state in a time range M3 between the time range M1 and the time range M2. The frame G3 includes a plurality of (here, continuous) such periods H3.

Here, as an example, an end time of the time range M1 and a start time of the time range M3 match, and an end time of the time range M3 and a start time of the time range M2 match. That is, here, the discharge gates 6a and 6b are in an ON state in the entire time range between the time range M1 in which the charge transfer gate 4a is in an ON state and the time range M2 in which the charge transfer gate 4b is in an ON state.

Further, in the period H4 belonging to the frame G4, first, the charge transfer signal VTX1 is applied to the charge transfer gate 4a via the transfer electrode TX1 so that the charge transfer gate 4a is brought into an ON state in a time range N1. Next, in the period H4, the charge transfer signal VTX2 is applied to the charge transfer gate 4b via the transfer electrode TX2 so that the charge transfer gate 4b is brought into an ON state in a time range N2. On the other hand, in the period H4, the charge transfer signal VTX5=Drain is applied to the discharge gates 6a and 6b via the transfer electrodes TX5 so that the discharge gates 6a and 6b are brought into an ON state in a time range N3 between the time range N1 and the time range N2. The frame G4 includes a plurality of (here, continuous) such periods H4. Further, the time ranges J1 and J2, the time ranges K1 and K2, the time ranges M1 and M2, and the time ranges N1 and N2 each have the same length as each other.

Here, as an example, an end time of the time range N1 and a start time of the time range N3 match, and an end time of the time range N3 and a start time of the time range N2 match. That is, here, the discharge gates 6a and 6b are in an ON state in the entire time range between the time range N1 in which the charge transfer gate 4a is in an ON state and the time range N2 in which the charge transfer gate 4b is in an ON state.

As described above, here, the timing generator 53 generates the charge transfer signal so that the first charge transfer gate is brought into a charge transfer state in the first time range, the second charge transfer gate is brought into a charge transfer state in the second time range separated from the first time range, and the discharge gate is brought into a charge discharge state in the third time range between the first time range and the second time range.

As an example, when it is focused on the frame G1, the timing generator 53 generates the charge transfer signals VTX1, VTX2, and VTX5=Drain so that the charge transfer gate 4a (the first charge transfer gate) is brought into an ON state in the time range J1 (the first time range), the charge transfer gate 4b (the second charge transfer gate) is brought into an ON state in the time range J2 (the second time range) separated from the time range J1, and the discharge gates 6a and 6b are brought into an ON state in the time range J3 (the third time range) between the time range J1 and the time range J2. The same applies to the other frames G2 to G4.

Here, when it is assumed that the time ranges J1, K1, M1, and N1 for bringing the charge transfer gate 4a into an ON state is a first time range, the time ranges J2, K2, M2, and N2 for bringing the charge transfer gate 4b into an ON state is a second time range, and the time ranges J3, K3, M3, and N3 for bringing the discharge gates 6a and 6b into an ON state is a third time range, the first time range, the second time range, and the third time range are included in all the frames G1 to G4. Further, as an example, when a start time of the frame G1 and a start time of the frame G2 are made to match, the time range K2 is positioned between the time range J1 and the time range J2. The same applies to the frame G2 and the frame G3, and the frame G3 and the frame G4.

That is, here, the timing generator 53 generates the charge transfer signal so that the first time range, the second time range, and the third time range are included in each of the plurality of frames, and when a start time of the n-th (n is an integer of 1 or more) frame and a start time of the m-th (m is an integer of 1 or more different from n) frame are made to match, the first time range of the m-th frame is positioned between the first time range of the n-th frame and the second time range of the n-th frame when a start time of the n-th frame and a start time of the m-th frame are made to match.

Further, the timing generator 53 generates the charge transfer signal so that the first charge transfer gate and the second charge transfer gate are brought into a charge transfer state in overlapping time ranges when a start time of a period is made to match over a plurality of the periods in one frame. As an example, the timing generator 53 generates the charge transfer signals VTX1 and VTX2 so that the charge transfer gates 4a and 4b are brought into an ON state in the overlapping time ranges J1 and J2 when the start time H1a of the period H1 is made to match over a plurality of the period H1 in the frame G1. Thereby, integration of electric charge is performed in the charge accumulation part. The same applies to other frames and periods.

As described above, in the photosensor 50 and the driving method for the photosensor 50 according to the second embodiment, the charge transfer signals VTX1 and VTX2 applied to the charge transfer gates 4a and 4b for transferring electric charge generated in the light receiving part 2 are configured to bring the charge transfer gate 4a into an ON state in the first time range (for example, the time range J1), bring the charge transfer gate 4b into an ON state in the second time range (for example, the time range J2) separated from the first time range, and bring the discharge gates 6a and 6b into an ON state in the third time range (for example, the time range J3) between the first time range and the second time range. In this way, the ON periods of the charge transfer gates 4a and 4b are separated and the discharge period of the electric charge is provided therebetween, and thereby unread electric charge generated in the light receiving part 2 can be discharged. As a result, a detection accuracy can be improved.

Also, in the photosensor 50 according to the second embodiment, the timing generator 53 generates the charge transfer signals VTX1 and VTX2 so that the first time range, the second time range, and the third time range are included in each of the plurality of frames, and the first time range (for example, the time range K2) of an m-th frame is positioned between the first time range (for example, the time range J1) of an n-th frame and the second time range (for example, the time range J2) of the n-th frame when a start time of the n-th frame (for example, the frame G1) and a start time of the m-th frame (for example, the frame G2) are made to match. Therefore, the detection accuracy can be further improved by disposing the ON periods of the charge transfer gates 4a and 4b more densely over the plurality of frames.

Further, in the photosensor 50 according to the second embodiment, the timing generator 53 generates the charge transfer signals VTX1 and VTX2 so that the charge transfer gates 4a and 4b are brought into an ON state in an overlapping time range when a start time (for example, the start times H1a) of a period is made to match over a plurality of the periods (for example, the periods H1) in one frame (for example, the frame G1). Therefore, integration of electric charge can be performed in one frame.

Modified Example According to the Second Embodiment

The second embodiment described above has described one embodiment of the present disclosure. Therefore, the present disclosure is not limited to the above-described embodiment and may be arbitrarily modified.

For example, in the second embodiment, a configuration in which the photosensor 50 includes two charge transfer gates 4a and 4b for each of the pixel units RS has been described, but the photosensor 50 may include four charge transfer gates 4a to 4d for each of the pixel units RS. In this case, at least a pair (or all) of the four charge transfer gates 4a to 4d, and the discharge gates 6a, 6b can have the above-described relationship, that is, the timing generator 53 can generate charge transfer signal so that the first charge transfer gate is brought into a charge transfer state in the first time range, the second charge transfer gate is brought into a charge transfer state in the second time range separated from the first time range, and the discharge gate is brought into a charge discharge state in the third time range between the first time range and the second time range.

Also, in the second embodiment described above, a case in which the discharge gates 6a and 6b are in an ON state in the entire time range between the first time range (for example, the time range J1) in which the charge transfer gate 4a is in an ON state and the second time range (for example, the time range J2) in which the charge transfer gate 4b is in an ON state has been exemplified. However, the timing generator 53 may generate the charge transfer signals VTX1, VTX2, and VTX5=Drain so that the discharge gates 6a and 6b are in an ON state in a part of time range between the first time range (for example, the time range J1) in which the first charge transfer gate (for example, the charge transfer gate 4a) is in an ON state and the second time range (for example, the time range J2) in which the second charge transfer gate (for example, the charge transfer gate 4b) is in an ON state. In this case, the discharge gates 6a and 6b can be in an ON state until immediately before the second charge transfer gate is brought into an ON state.

Also, in the second embodiment, a case in which the timing generator 53 generates the charge transfer signals VTX1, VTX2, and VTX5=Drain over a plurality of frames G1 to G4 has been described, but only one frame may be used.

Also, in the second embodiment, when the photodetector is applied to a phenomenon that does not require irradiation of the excitation light L1, the periods H1 to H4 may not be synchronized with the timing at which the light source 51 outputs the excitation light L1. Particularly, the photosensor 50 and the driving method for the photosensor 50 according to the second embodiment can achieve an improvement in detection accuracy by discharging unread electric charge of the light receiving part 2 even in detection of a non-repeating phenomenon other than a phenomenon that occurs repeatedly.

Further, the frames G1 to G4 are not limited to a case of being defined as a period between a pair of reset processes, and may be arbitrarily set. For example, the frames G1 to G4 may be set with reading of signals from the charge accumulation part (the third semiconductor region 9a to 9d) as a reference, and one image may be set as one frame when the photosensor 50 is a motion sensor.

Further, all or a part of all the matters related to the operation and control of the discharge gates 6a and 6b of the second embodiment and the modified example of the second embodiment described above can be arbitrarily selected and applied to the photosensor 50 according to the first embodiment.

Modified Example Common to First Embodiment and Second Embodiment

In the photosensor 50 described above, signals from the charge transfer gates 4a to 4d may be read in one frame and accumulated in the charge accumulation part (the third semiconductor region 9a to 9d), or the signals may be read by a circuit in a subsequent stage each time the charge transfer gates 4a to 4d are ON regardless of the presence or absence of the charge accumulation part.

Also, in the above-described optical sensor 50, a photogate structure has been exemplified as the light receiving part 2. However, the light receiving part 2 is not limited to the photogate structure and may also have another structure. As an example, as illustrated in FIG. 13(a), the light receiving part 2 may have an embedded PD structure. In this case, the light receiving part 2 is configured by a $p^+$-type semiconductor region 2B provided in the second semiconductor region 5 on the second main surface 1b side, and an n-type semiconductor region 2A provided in the second semiconductor region 5 just below the semiconductor region 2B.

Figure 13:
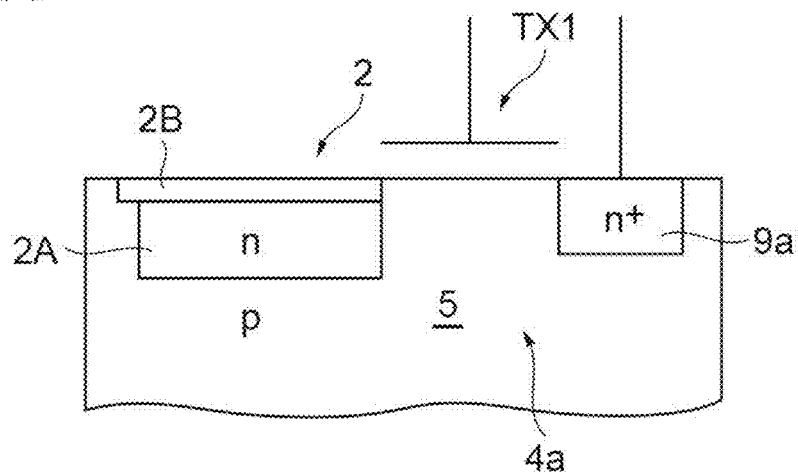
FIG. 13 is a diagram for explaining a modified example of a light receiving part.
Figure 13:
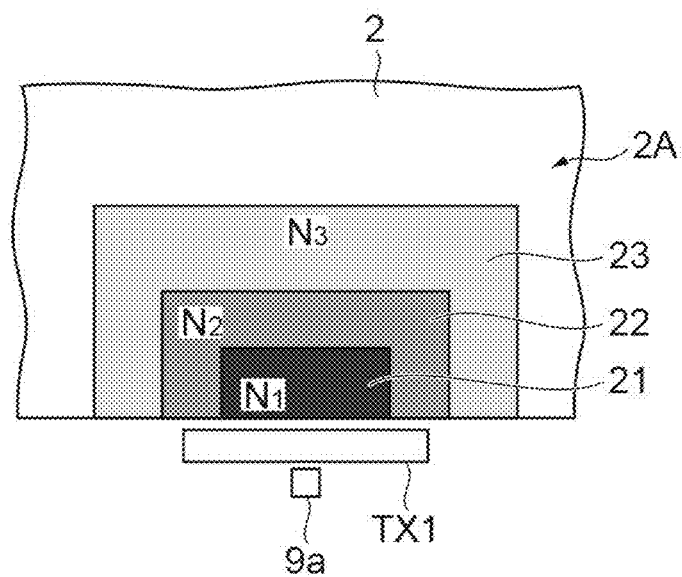
Figure 13:
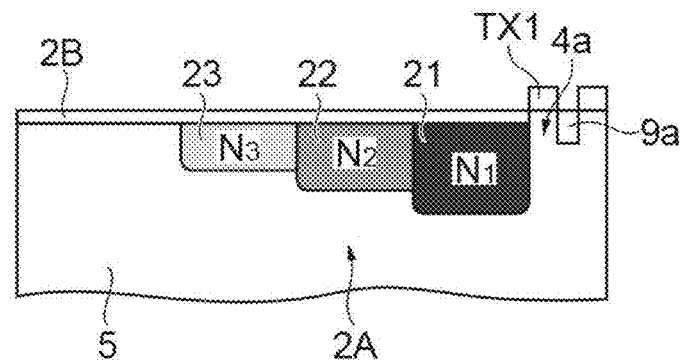

In this case also, a potential gradient can be provided in the light receiving part 2 to perform high-speed charge transfer. As an example of the configuration for that purpose, as illustrated in FIGS. 13(*b*) and 13(*c*), a configuration in which the n-type semiconductor region 2A includes a plurality (here, three) of n-type semiconductor regions 21, 22, and 23 disposed so that, for example, an impurity concentration increases toward the transfer gate 4*a*, and thereby forming an electric field gradient can be exemplified. Further, FIG. 13(*b*) is a schematic cross-sectional view, and FIG. 13(*c*) is a plan view.

Figure 14:
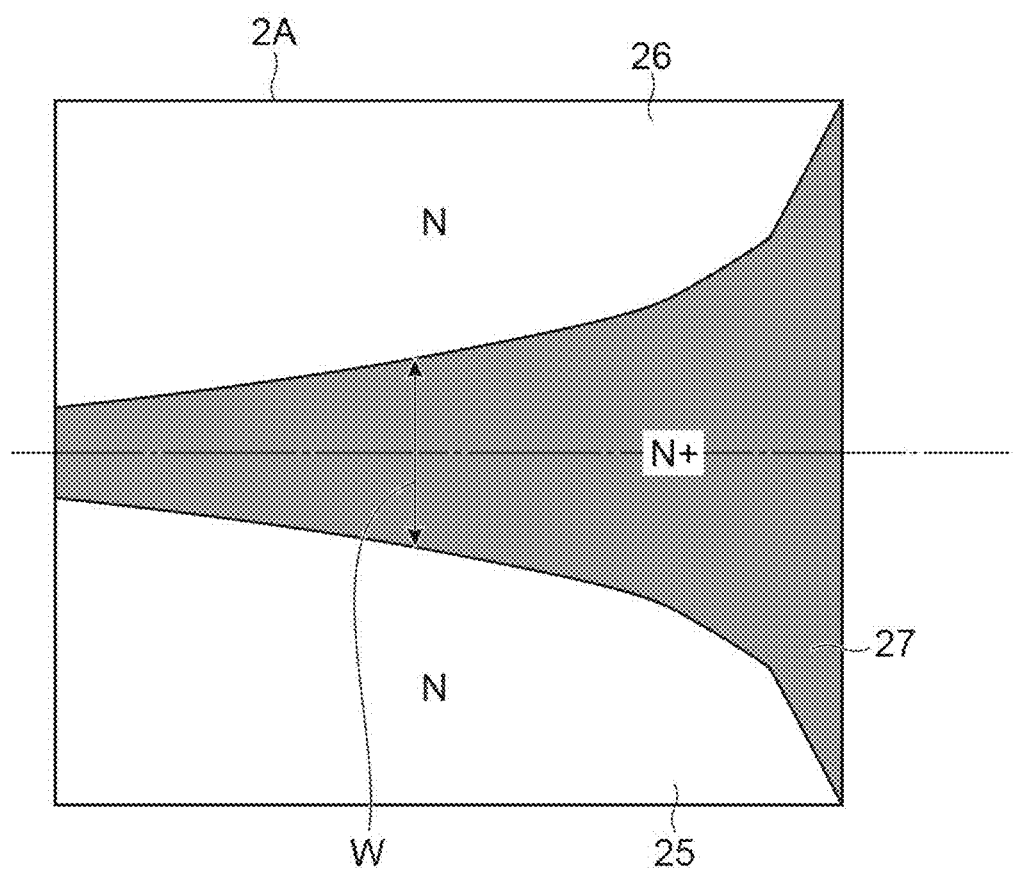
FIG. 14 is a diagram for explaining another modified example of the light receiving part.

Also, as a configuration for providing a potential gradient in the light receiving part 2, as illustrated in FIG. 14, a configuration in which the n-type semiconductor region 2A includes a pair of n-type semiconductor regions 25 and 26, and an n$^+$-type semiconductor region 27 that is sandwiched between the semiconductor regions 25 and 26 and whose width W extends toward, for example, the transfer gate 4*a*, and thereby forming an electric field gradient can be exemplified. Further, FIG. 14 is a plan view from the second main surface 1*b* side.

Further, the photosensor 50 described above can be used, for example, for detecting a moving body. In this case, the photosensor 50 can perform detection of a moving object by utilizing the fact that a change appears only in a moved pixel unit RS when a difference between a shutter signal of an n-th frame and another shutter signal of the same n-th frame (or a shutter signal of n+1-th frame) is taken. Even in such a case, an improvement in detection accuracy can be achieved by performing the control (the driving method) of the charge transfer gates 4*a* to 4*d* and the discharge gates 6*a* and 6*b* as described above. Further, the light generated by the light source 51 is not limited to the pulsed light such as the excitation light L1 described above, and may be light with an arbitrary waveform such as a sine wave or a sawtooth wave.

A photosensor in which a detection accuracy can be improved, and a driving method for the photosensor are provided.

REFERENCE SIGNS LIST

2 Light receiving part
4*a* to 4*d* Charge transfer gate (first charge transfer gate, second charge transfer gate)
6*a*, 6*b* Discharge gate
50 Photosensor
53 Timing generator (signal generation unit)
A1 to A4, G1 to G4 Frame
B1 to B4 Period (first period, second period)
H1 to H4 Period (first period, second period)
C1 to C4, D1 to D4, E1 to E4, F1 to F4 Time range (first time range, second time range)
J1, J2, K1, K2, M1, M2, N1, N2 Time range (first time range, second time range)
J3, K3, M3, N3 Time range (third time range)

The invention claimed is:

1. A photosensor comprising:
a light receiving part configured to generate electric charge according to incident light;
a charge transfer gate configured to transfer the electric charge generated in the light receiving part;
a discharge gate configured to discharge the electric charge generated in the light receiving part; and
a signal generation unit configured to generate a light source signal for a light source to periodically output light and a charge transfer signal applied to the charge transfer gate, wherein
the signal generation unit generates the charge transfer signal so that the charge transfer gate is brought into a charge transfer state in a first time range of a first period belonging to a first frame and the charge transfer gate is brought into a charge transfer state in a second time range of a second period belonging to a second frame,
the first frame and the second frame occur at different times from each other,
a start time of the first period is synchronized with a timing at which the light source outputs the light during the first frame, a start time of the second period is synchronized with a timing at which the light source outputs the light during the second frame,
when a start time of the first period and a start time of the second period are made to match based on the timing of outputting the light, the first time range and the second time range partially overlap each other such that a second length of time of the first time range overlaps a first length of time of the second time range whereas a first length of time of the first time range does not overlap with a second length of time of the second time range,
in the first time range and the second time range, the discharge gate is in a charge non-discharge state, and
in the first time range and the second time range, time ranges in which the electric charge is transferred overlap each other.

2. The photosensor according to claim 1, wherein the first frame and the second frame are frames continuous with each other.

3. The photosensor according to claim 1, wherein the signal generation unit generates the charge transfer signal so that the charge transfer gate is brought into a charge transfer state in an overlapping time range when a start time of a period is made to match over a plurality of the periods in one frame.

4. The photosensor according to claim 1, wherein
the charge transfer gate includes a first charge transfer gate and a second charge transfer gate, and
the signal generation unit generates the charge transfer signal so that one of the first charge transfer gate and the second charge transfer gate is brought into a charge transfer state in the first time range, and the one of the first charge transfer gate and the second charge transfer gate is brought into a charge transfer state in the second time range.

5. The photosensor according to claim 1, wherein
the charge transfer gate includes a first charge transfer gate and a second charge transfer gate, and
the signal generation unit generates the charge transfer signal so that one of the first charge transfer gate and the second charge transfer gate is brought into a charge transfer state in the first time range, and the other of the first charge transfer gate and the second charge transfer gate is brought into a charge transfer state in the second time range.

6. The photosensor according to claim 1, wherein
the charge transfer gate includes a first charge transfer gate and a second charge transfer gate,
the signal generation unit generates the charge transfer signal so that the first charge transfer gate is brought into a charge transfer state in the first time range, and the first charge transfer gate is brought into a charge transfer state in the second time range,
the second charge transfer gate is brought into a charge transfer state in a third time range of the first period, and the second charge transfer gate is brought into a charge transfer state in a fourth time range of the second period, and a part of the third time range and a part of the fourth time range overlap each other when a start time of the first period and a start time of the second period are made to match.

7. The photosensor according to claim 1,
wherein the signal generation unit generates the charge transfer signal so that the charge transfer gate is brought into a charge transfer state in a fifth time range, the charge transfer gate is brought into a charge transfer state in a sixth time range separated from the fifth time range, and the discharge gate is brought into a charge discharge state in a seventh time range between the fifth time range and the sixth time range.

8. A driving method for a photosensor which is a driving method for a photosensor including a light receiving part configured to generate electric charge according to incident light, a charge transfer gate configured to transfer the electric charge generated in the light receiving part, and a discharge gate configured to discharge the electric charge generated in the light receiving part, the driving method comprising:
generating a charge transfer signal applied to the charge transfer gate so that the charge transfer gate is brought into a charge transfer state in a first time range of a first period belonging to a first frame and the charge transfer gate is brought into a charge transfer state in a second time range of a second period belonging to a second frame,
wherein
the first frame and the second frame occur at different times from each other,
a start time of the first period is synchronized with a timing at which a light source outputs a light during the first frame, a start time of the second period is synchronized with a timing at which the light source outputs the light during the second frame,
when a start time of the first period and a start time of the second period are made to match based on the timing of outputting the light, the first time range and the second time range partially overlap each other such that a second length of time of the first time range overlaps a first length of time of the second time range whereas a first length of time of the first time range does not overlap with a second length of time of the second time range,
in the first time range and the second time range, the discharge gate is in a charge non-discharge state, and
in the first time range and the second time range, time ranges in which the electric charge is transferred overlap each other.

9. A photosensor comprising:
a light receiving part configured to generate electric charge according to incident light;
a charge transfer gate configured to transfer the electric charge generated in the light receiving part; and
a discharge gate configured to discharge the electric charge generated in the light receiving part; and
a signal generation unit configured to generate a light source signal for a light source to periodically output light and a charge transfer signal applied to the charge transfer gate, wherein
the signal generation unit generates the charge transfer signal so that the charge transfer gate is brought into a charge transfer state in a first time range of a first period belonging to a first frame and the charge transfer gate is brought into a charge transfer state in a second time range of a second period belonging to a second frame, the first frame and the second frame occur at different times from each other,
a start time of the first period is synchronized with a timing at which the light source outputs the light during the first frame, a start time of the second period is synchronized with a timing at which the light source outputs the light during the second frame,
when a start time of the first period and a start time of the second period are made to match based on the timing of outputting the light, the first time range and the second time range partially overlap each other such that a second length of time of the first time range overlaps a first length of time of the second time range whereas a first length of time of the first time range does not overlap with a second length of time of the second time range,
in the first time range and the second time range, timings in which the discharge gate is in a charge non-discharge state partially overlap each other, and
in the first time range and the second time range, time ranges in which the electric charge is transferred overlap each other.

10. The photosensor according to claim 9, wherein the first frame and the second frame are frames continuous with each other.

11. The photosensor according to claim 9, wherein the signal generation unit generates the charge transfer signal so that the charge transfer gate is brought into a charge transfer state in an overlapping time range when a start time of a period is made to match over a plurality of the periods in one frame.

12. The photosensor according to claim 9, wherein
the charge transfer gate includes a first charge transfer gate and a second charge transfer gate, and
the signal generation unit generates the charge transfer signal so that one of the first charge transfer gate and the second charge transfer gate is brought into a charge transfer state in the first time range, and the one of the first charge transfer gate and the second charge transfer gate is brought into a charge transfer state in the second time range.

13. The photosensor according to claim 9, wherein
the charge transfer gate includes a first charge transfer gate and a second charge transfer gate, and
the signal generation unit generates the charge transfer signal so that one of the first charge transfer gate and the second charge transfer gate is brought into a charge transfer state in the first time range, and the other of the first charge transfer gate and the second charge transfer gate is brought into a charge transfer state in the second time range.

14. The photosensor according to claim 9, wherein
the charge transfer gate includes a first charge transfer gate and a second charge transfer gate,
the signal generation unit generates the charge transfer signal so that the first charge transfer gate is brought into a charge transfer state in the first time range, and the first charge transfer gate is brought into a charge transfer state in the second time range,
the second charge transfer gate is brought into a charge transfer state in a third time range of the first period, and the second charge transfer gate is brought into a charge transfer state in a fourth time range of the second period, and a part of the third time range and a part of the fourth time range overlap each other when a start time of the first period and a start time of the second period are made to match.

15. The photosensor according to claim 9, wherein the signal generation unit generates the charge transfer signal so that the charge transfer gate is brought into a charge transfer state in a fifth time range, the charge transfer gate is brought into a charge transfer state in a sixth time range separated from the fifth time range, and the discharge gate is brought into a charge discharge state in a seventh time range between the fifth time range and the sixth time range.

16. A driving method for a photosensor which is a driving method for a photosensor including a light receiving part configured to generate electric charge according to incident light, and a charge transfer gate configured to transfer the electric charge generated in the light receiving part, and a discharge gate configured to discharge the electric charge generated in the light receiving part, the driving method comprising:

generating a charge transfer signal applied to the charge transfer gate so that the charge transfer gate is brought into a charge transfer state in a first time range of a first period belonging to a first frame and the charge transfer gate is brought into a charge transfer state in a second time range of a second period belonging to a second frame, wherein the first frame and the second frame occur at different times from each other, a start time of the first period is synchronized with a timing at which a light source outputs a light during the first frame, a start time of the second period is synchronized with a timing at which the light source outputs the light during the second frame, when a start time of the first period and a start time of the second period are made to match based on the timing of outputting the light, the first time range and the second time range partially overlap each other such that a second length of time of the first time range overlaps a first length of time of the second time range whereas a first length of time of the first time range does not overlap with a second length of time of the second time range, in the first time range and the second time range, timings in which the discharge gate is in a charge non-discharge state partially overlap each other, and in the first time range and the second time range, time ranges in which the electric charge is transferred overlap each other.

* * * * *